(12) United States Patent
Shin et al.

(10) Patent No.: US 12,169,424 B2
(45) Date of Patent: Dec. 17, 2024

(54) ELECTRONIC DEVICE INCLUDING PROTECTIVE COVER FOR PROTECTING FLEXIBLE DISPLAY

(71) Applicant: SAMSUNG ELECTRONICS CO., LTD., Suwon-si (KR)

(72) Inventors: Moonchul Shin, Suwon-si (KR); Youngmin Kang, Suwon-si (KR); Yeonggyu Yoon, Suwon-si (KR); Seungjoon Lee, Suwon-si (KR); Joongyeon Cho, Suwon-si (KR); Jungyoung Choi, Suwon-si (KR); Myunghoon Kwak, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/903,294

(22) Filed: Sep. 6, 2022

(65) Prior Publication Data
US 2023/0161385 A1 May 25, 2023

Related U.S. Application Data

(63) Continuation of application No. PCT/KR2022/011518, filed on Aug. 4, 2022.

(30) Foreign Application Priority Data

Nov. 24, 2021 (KR) .................. 10-2021-0163056

(51) Int. Cl.
*G06F 1/16* (2006.01)
*H01Q 1/24* (2006.01)

(52) U.S. Cl.
CPC .......... *G06F 1/1656* (2013.01); *G06F 1/1624* (2013.01); *G06F 1/1652* (2013.01); *H01Q 1/243* (2013.01)

(58) Field of Classification Search
CPC .... G06F 1/1656; G06F 1/1624; G06F 1/1652; G06F 1/1616; G06F 1/1641; H01Q 1/243;
(Continued)

(56) References Cited

U.S. PATENT DOCUMENTS 7,558,057 B1 * 7/2009 Naksen ................. G06F 1/1613
361/679.56
8,836,881 B2 9/2014 Tanaka
(Continued)

FOREIGN PATENT DOCUMENTS

CN 212627983 U 2/2021
JP 2008-158432 A2 7/2008
(Continued)

OTHER PUBLICATIONS

International Search Report dated Nov. 11, 2022 for PCT/KR2022/011518.
(Continued)

*Primary Examiner* — Michael P McFadden
(74) *Attorney, Agent, or Firm* — Nixon & Vanderhye P.C.

(57) ABSTRACT

An electronic device may include a first housing including an antenna provided on a side surface thereof, a second housing configured to slide in a first direction to be drawn out of the first housing and to slide in a direction opposite to the first direction to be drawn into the first housing, a flexible display including a first side comprising a fixed portion and a second side provided to be drawn out of an inside of the first housing or drawn into the inside of the first housing according to an operation of the second housing, and a protective cover provided between the fixed portion and the first housing to contact at least a portion of an upper portion of the fixed portion. A first space may be provided between the protective cover and a side portion of the fixed portion.

20 Claims, 25 Drawing Sheets

(58) Field of Classification Search
CPC .... H05K 5/0017; H05K 1/028; H05K 5/0217; H05K 5/03; H05K 7/1427; H05K 2201/051; H05K 2201/10128; G09F 9/301; G09F 15/0062; H01L 27/3237; H01L 2251/5338; H04M 1/0268; E05F 1/1016
See application file for complete search history.

(56) References Cited

U.S. PATENT DOCUMENTS

| | | | |
|---|---|---|---|
| 8,896,994 B2 | 11/2014 | Abe et al. | |
| 9,578,149 B2* | 2/2017 | Moon | H04M 1/0268 |
| 10,904,371 B1* | 1/2021 | Song | G06F 1/1656 |
| 2006/0166713 A1* | 7/2006 | Yeh | G06F 1/1626 |
| | | | 455/575.1 |
| 2016/0299527 A1* | 10/2016 | Kwak | G06F 1/1626 |
| 2018/0364760 A1* | 12/2018 | Ahn | G06F 3/0412 |
| 2019/0296259 A1 | 9/2019 | Baek et al. | |
| 2022/0035407 A1* | 2/2022 | Song | G06F 1/1652 |
| 2022/0124189 A1* | 4/2022 | Song | H04M 1/0237 |
| 2023/0099802 A1 | 3/2023 | An et al. | |

FOREIGN PATENT DOCUMENTS

| | | |
|---|---|---|
| JP | 2012-212220 A2 | 11/2012 |
| KR | 10-2017-0064360 A | 6/2017 |
| KR | 10-2017-0095938 | 8/2017 |
| KR | 10-2018-0015003 A | 2/2018 |
| KR | 10-2020-0100385 | 8/2020 |
| KR | 10-2020-0127741 A | 11/2020 |
| KR | 10-2020-0137902 A | 12/2020 |
| KR | 10-2205281 | 1/2021 |
| KR | 10-2021-0047753 A | 4/2021 |
| KR | 10-2262991 B1 | 6/2021 |
| KR | 10-2021-0116380 A | 9/2021 |
| WO | WO 2021/225251 A | 11/2021 |

OTHER PUBLICATIONS

International Search Written Opinion dated Nov. 11, 2022 for PCT/KR2022/011518.

Extended European Search Report dated Sep. 30, 2024 for EP Application No. 22898762.4.

* cited by examiner

Display Roll Out

ELECTRONIC DEVICE INCLUDING PROTECTIVE COVER FOR PROTECTING FLEXIBLE DISPLAY

CROSS REFERENCE TO RELATED APPLICATION

This application is a continuation of International Application No. PCT/KR2022/011518 designating the United States, filed on Aug. 4, 2022, in the Korean Intellectual Property Receiving Office and claiming priority to Korean Patent Application No. 10-2021-0163056, filed on Nov. 24, 2021, the disclosures of which are hereby incorporated herein by reference for all purposes as if fully set forth herein.

BACKGROUND

Field

An embodiment relates to an electronic device including a protective cover for protecting a flexible display.

Description of Related Art

Electronic devices are slimmed down and enhanced to differentiate functional elements while reinforcing their design aspects. Electronic devices are evolving to have various shapes as well as their stereotypical rectangular shape. Electronic devices may have a transformable structure that allows for use of a larger display and ease to carry. In an example transformable structure, an electronic device may have a structure (e.g., a rollable structure or a slidable structure) capable of changing the display area of the flexible display through support by housings that are slidable on each other. A rollable electronic device (or a slidable electronic device) may be configured to allow the flexible display (or rollable display) to be rolled up or unrolled. A slidable electronic device may be configured such that the flexible display is slid to enlarge or shrink the screen.

SUMMARY

In an electronic device having a rollable display, the rollable display may include a plurality of layers. When the rollable display is pulled in/out, a slip occurs between the plurality of layers, causing a side of the rollable display to be lifted. Further, an extension, which extends from a side of the flexible display and bends at about 180 degrees to connect to the flexible printed circuit board disposed on the rear surface of the flexible display, is vulnerable to external impact.

Various example embodiments provide an electronic device capable of protecting the edge of the rollable display, which is vulnerable to external impact, and preventing or reducing the likelihood of a peel-off at the edge.

According to an embodiment, an electronic device may comprise a first housing including an antenna provided on a side surface thereof, a second housing provided to slide in a first direction to be at least partially drawn out of the first housing and to slide in a direction opposite to the first direction to be drawn into the first housing, a flexible display including a first side including a fixed portion and a second side provided to be drawn out of an inside of the first housing and/or drawn into the inside of the first housing based on at least an operation of the second housing, and a protective cover provided between at least the fixed portion and the first housing to contact at least a portion of an upper portion of the fixed portion. A first space may be provided between at least the protective cover and a side portion of the fixed portion.

According to various example embodiments, the protective cover provided in the electronic device may protect the extension provided in the fixed portion (or edge portion) of the rollable display from external impact and prevent or reduce the likelihood of the edge portion from being lifted when the rollable display is pulled in/out.

BRIEF DESCRIPTION OF THE DRAWINGS

The above and other aspects, features, and advantages of certain example embodiments of the present disclosure will be more apparent from the following detailed description, taken in conjunction with the accompanying drawings, in which.

DETAILED DESCRIPTION

Hereinafter, the disclosure is described in detail with reference to the accompanying drawings. In the following description, specific details, such as detailed configurations and components, will be provided merely for a better understanding of embodiments. Accordingly, it should be apparent to one of ordinary skill in the art that various changes and modifications may be made to the embodiments described herein without departing from the scope and spirit. Further, no description is made of well-known functions and configurations for clarity and brevity.

Figure 1:
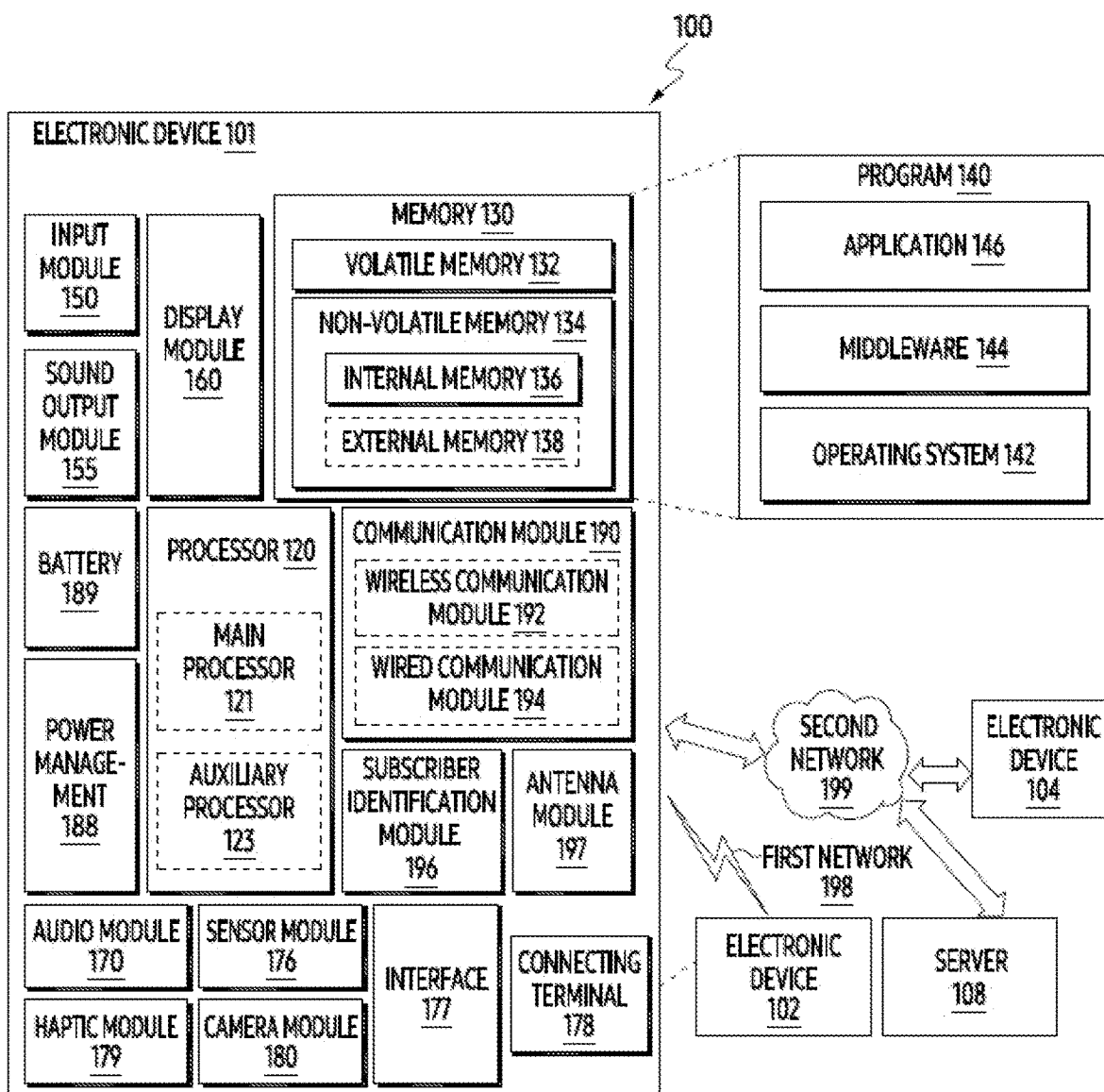
FIG. 1 is a block diagram illustrating an electronic device in a network environment according to an example embodiment.

FIG. 1 is a block diagram illustrating an electronic device in a network environment according to an embodiment.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
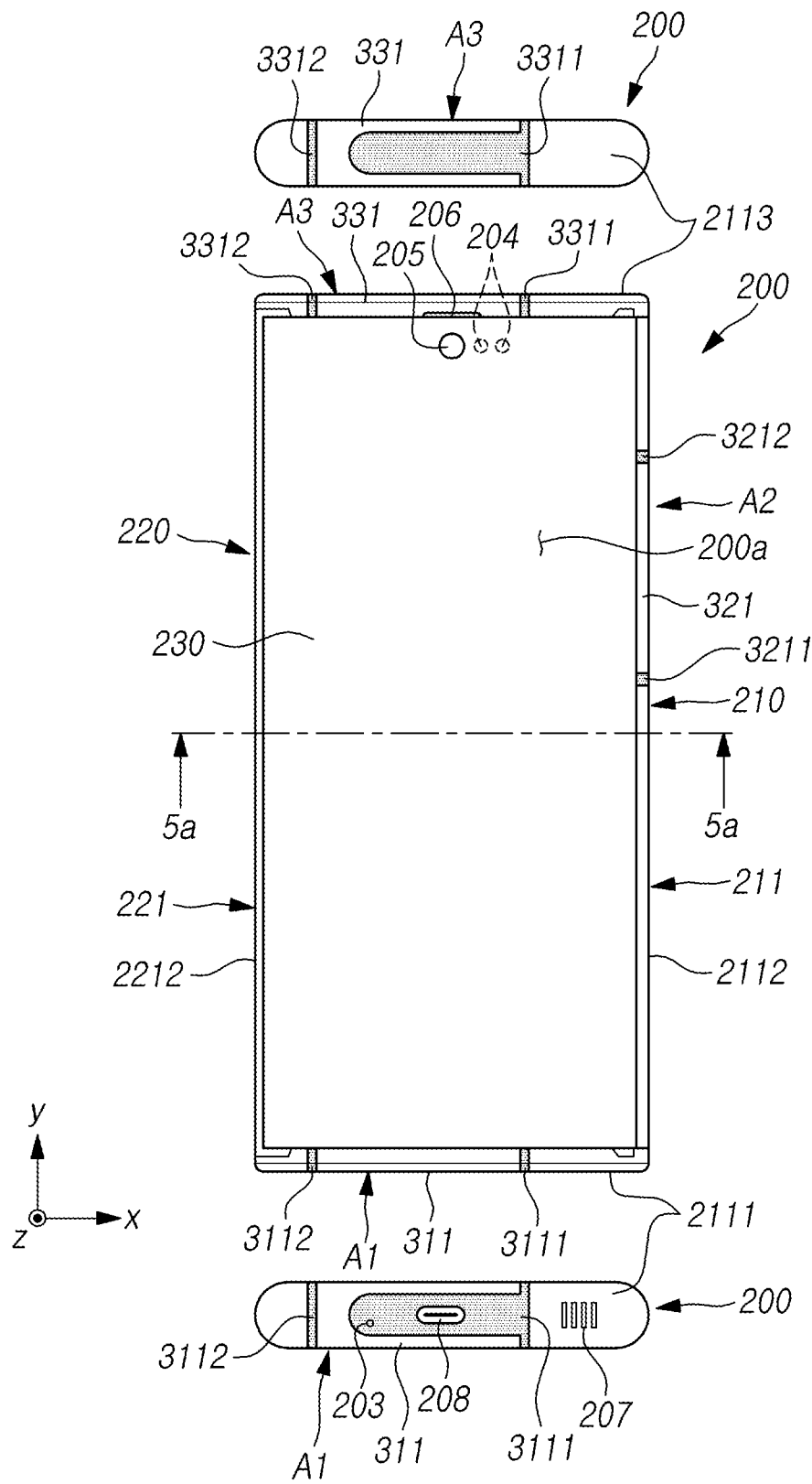
FIGS. 2A and 2B are front and rear views, respectively, illustrating an electronic device in a closed state according to an example embodiment.
Figure 2B:
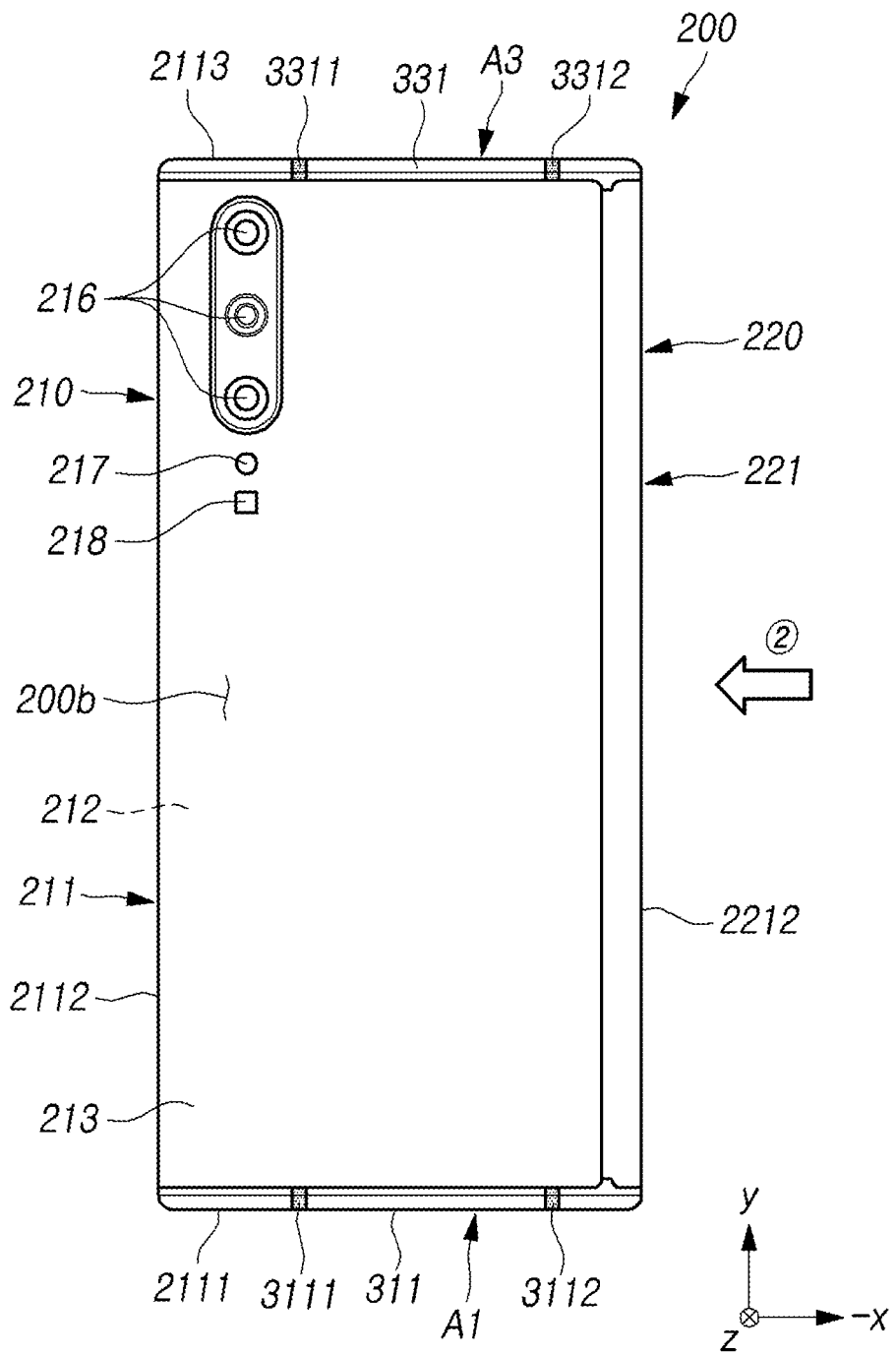
Figure 3A:
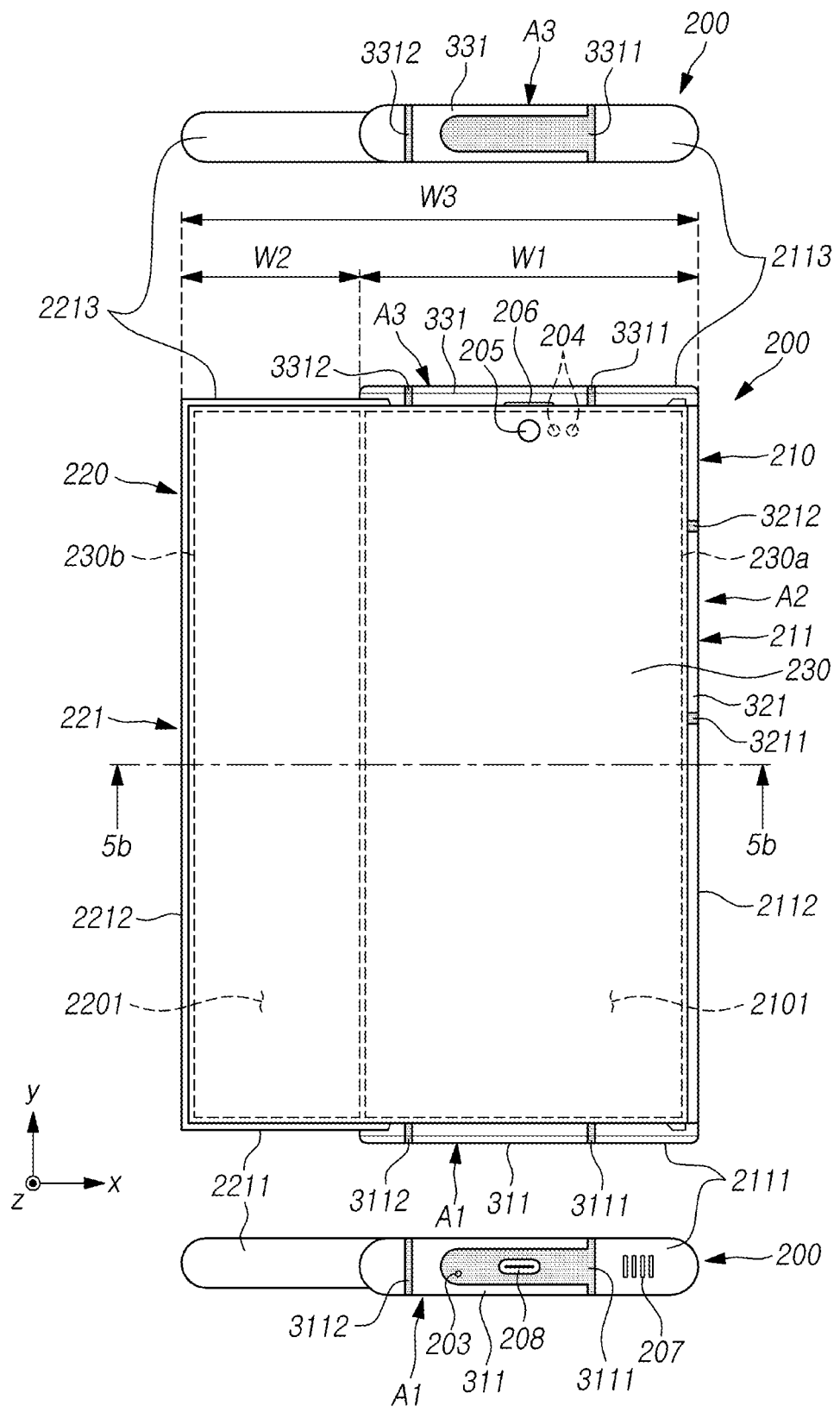
FIGS. 3A and 3B are front and rear views, respectively, illustrating an electronic device in an open state according to an example embodiment.
Figure 3B:
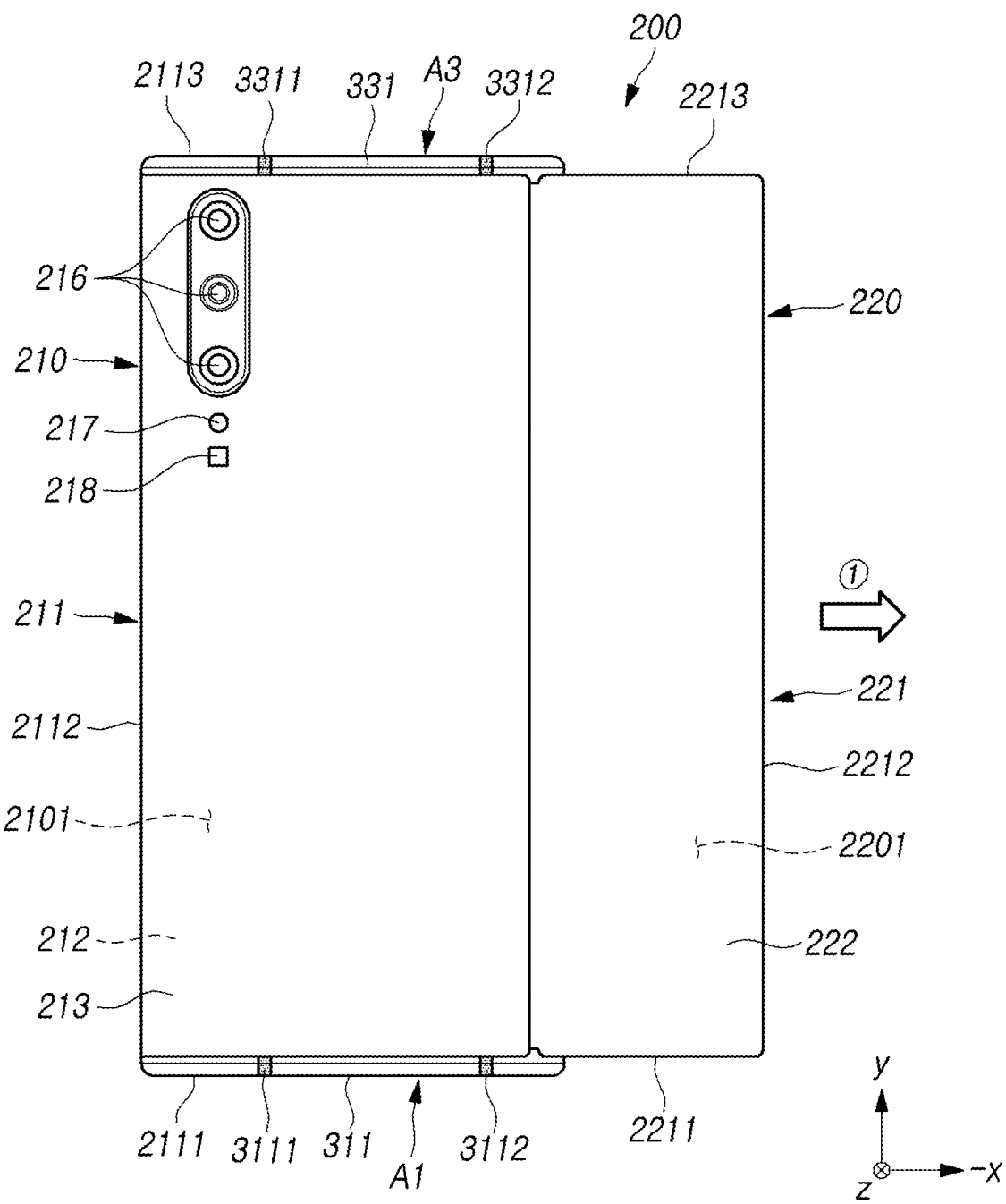

FIGS. 2A and 2B are front and rear views illustrating an electronic device in a closed state according to an example embodiment. FIGS. 3A and 3B are front and rear views illustrating an electronic device in an open state according to an example embodiment.

According to an embodiment, the electronic device 200 of FIGS. 2A to 3B may be at least partially similar to the electronic device 101 of FIG. 1 or may include other embodiments of the electronic device. Any embodiment herein may be used in combination with any other embodiment herein.

Referring to FIGS. 2A to 3B, an electronic device 200 may include a flexible display 230 (e.g., expandable display, stretchable display, rollable display, or display assembly) (e.g., the display module 160 or display assembly of FIG. 1) where at least two housings are stacked in the upper and lower directions and coupled to be slidable in a specific direction. The flexible display 230 may be driven so that its display area is varied, e.g., as one housing slides along the other housing in the specific direction. According to an embodiment, the electronic device 200 may include a first housing 210 (e.g., first housing structure or base housing), a second housing 220 (e.g., second housing structure or slide housing) coupled to be movable within a designated distance from the first housing 210 in a designated direction (e.g., x axis direction), and a flexible display 230 disposed to be supported by at least a portion of the first housing 210 and the second housing 220.

According to an embodiment, the electronic device 200 may switch from the open state to the closed state as at least a portion of the second housing 220 is received in a first receiving portion 2101 of the first housing 210. The electronic device 200 may switch from the closed state to the open state as at least the portion of the second housing 220, received in the first receiving portion 2101, is drawn out of the first receiving portion 2101.

According to an embodiment, the electronic device 200 may include a bendable member or bendable support member (e.g., the bendable member 240 of FIG. 4) (e.g., an articulated hinge module or multi-bar assembly). In the open state, the bendable member may be at least partially flush with at least a portion of the first housing 210. In the closed state, the bendable member may at least partially be received in a second receiving portion 2201 of the second housing 220.

According to an embodiment, as the second housing 220 slides along a designated direction (e.g., x axis direction) from the first housing 210, the electronic device 200 may lead to a change in the display area of the flexible display 230.

According to an embodiment, the display area of the display may be varied as the flexible display 230 is drawn in or out. The flexible display 230 may be drawn in or out by, e.g., an external force (e.g., the user's manipulation) or an internal force (e.g., the operation of the driving module 400). Draw-in may be a series of operations to shrink the screen of the flexible display 230. Draw-out may be a series of operations to enlarge the screen of the flexible display 230. For convenience of description, in the following description, the state in which the display area of the flexible display 230 has been maximized by draw-out or the state in which the draw-out has been done is denoted as an open state, and the state in which the display area of the flexible display 230 has been minimized is denoted as a closed state. For convenience of description, in the following description, the state of the flexible display 230 before draw-in or draw-out commences is denoted as a first state or an initial state, and the state of the flexible display 230 after draw-in or draw-out has been done is denoted as a second state or a switching state. During draw-in, the first state may be denoted as a first drawn-out state to indicate a state before the draw-in starts, and the second state may be denoted as a first drawn-in state to indicate a state after the draw-out has been done. In the draw-in, the first state may be denoted as a second drawn-in state to indicate a state before the draw-out starts, and the second state may be denoted as a second drawn-out state to indicate a state after the draw-out has been done.

According to an embodiment, a first area corresponding to at least a portion of the flexible display 230 supported by the bendable member (e.g., the bendable member 240 of FIG. 4) may be disposed not to be received in the first receiving portion 2101 of the first housing 210 or the second receiving portion 2201 of the second housing 220. The first area of the flexible display 230 drawn out of the receiving portion (e.g., the first receiving portion 2101 or the second receiving portion 2201) may be disposed to be visible from the outside (e.g., front surface). The first area may include an edge portion (e.g., the edge portion 231) of the display. A second area corresponding to at least a portion of the flexible display 230 supported by the bendable member (e.g., the bendable member 240 of FIG. 4) may be received in the first receiving portion 2101 of the first housing 210 or the second receiving portion 2201 of the second housing 220. The second area of the flexible display 230 received in the receiving portion (e.g., the first receiving portion 2101 or the second receiving portion 2201) may be disposed to be visible from the outside or to be visible from the rear surface alone, but not from the front surface.

The first area may be enlarged by draw-out or shrunken by draw-in. The second area may be shrunken by draw-out or enlarged by draw-in. The first area and the second area may be varied depending on the degree of draw-out or draw-in (e.g., the ratio of the corresponding area to the entire area (e.g., first area/entire area or second area/entire area). The edge portion (e.g., the edge portion 231) of the display may maintain a predetermined area regardless of draw-in or draw-out.

The first area may be used to display the image according to the operation, on the front surface, of the electronic device 200. The second area may be deactivated not to be used to display the image according to the operation of the electronic device 200 or be activated to be used to display the image according to the operation, on the rear surface, of the electronic device 200. The second area may be activated to be used to display the image according to the operation of the electronic device 200 only on the portion visible from the outside as at least a portion is drawn out. The bendable member may be disposed to be at least partially flush with, e.g., the first housing 210.

According to an embodiment, the electronic device 200 may include a front surface 200a (e.g., first surface), a rear surface 200b (e.g., second surface) facing away from the front surface 200a, and a side surface (e.g., first side member 211 or second side member 221) surrounding the space between the front surface 200a and the rear surface 200b. The side surface may be at least one of an upper surface, a lower surface, a left surface or a right surface of the front surface with respect to the front surface 200a.

According to an embodiment, the electronic device 200 may include a first housing 210 and a second housing 220. The first housing 210 may include a first side member 211. The second housing 220 may include a second side member 221. The first side member 211 may form an edge corresponding to at least three surfaces (e.g., the upper, lower, and right surfaces with respect to the front surface 200a) among the four surfaces of the first housing 210. The second side member 221 may form an edge corresponding to at least three surfaces (e.g., the upper, lower, and left surfaces with respect to the front surface) among the four surfaces of the second housing 220. However, this is an example, and the first side member 211 and the second side member 221 may have surfaces corresponding to one or two of the four surfaces of the first housing 210 and the second housing 220. Hereinafter, for convenience of description, the case of three surfaces is described as an example.

According to an embodiment, the first side member 211 may include at least one of a first side surface 2111 (e.g., a lower surface of the first housing 210), a second side surface 2112 (e.g., a right surface of the first housing 210), or a third side surface 2113 (e.g., an upper surface of the first housing 210) with respect to the front surface. The first side surface 2111 may have a first length along a first direction (e.g., x axis direction). The second side surface 2112 may extend to have a second length longer than the first length along a direction (e.g., y axis direction) substantially perpendicular to the first side surface 2111. The third side surface 2113 may extend substantially parallel to the first side surface 2111 from the second side surface 2112 and may have the first length. The first side member 211 may be, e.g., at least partially formed of a conductive material (e.g., metal). The first side member 211 may include, e.g., a first supporting member 212 extending to at least a portion of the first receiving unit/portion 2101 of the first housing 210.

According to an embodiment, the second side member 221 may include at least one of a fourth side surface 2211 (e.g., a lower surface of the second housing 220), a fifth side surface 2212 (e.g., a left surface of the second housing 220), or a sixth side surface 2213 (e.g., an upper surface of the second housing 220) with respect to the front surface. The fourth side surface 2211 at least partially corresponds to the first side surface 2111 and may have a third length. The fifth side surface 2212 may extend substantially parallel to the second side surface 2112 from the fourth side surface 2211 and may have a fourth length larger than the third length. The sixth side surface 2213 may extend substantially parallel to the third side surface 2113 from the fifth side surface 2212 and may have the third length. The second side member 221 may be, e.g., at least partially formed of a conductive material (e.g., metal). The second side member 221 may include, e.g., a second supporting member 222 extending to at least a portion of the second receiving unit/portion 2201 of the second housing 220. Each "receiving unit" (e.g., 2101, 2201) of a housing includes at least a receiving area of the housing.

According to an embodiment, the first side surface 2111 and the fourth side surface 2211 or the third side surface 2113 and the sixth side surface 2213 may be coupled to be slidable on each other. In this case, the whole or part of the fourth side surface 2211 overlaps the first side surface 2111 and may thus be disposed to be substantially invisible from the outside. Further, the whole or part of the sixth side surface 2213 overlaps the third side surface 2113 and may thus be disposed to be substantially invisible from the outside. For example, the fourth side surface 2211 or the sixth side surface 2213 may be disposed to be at least partially visible from the outside in the closed state.

According to an embodiment, when drawn in, the second supporting member 222 included in the second side member 221 overlaps the first supporting member 212 included in the first side member 211 and may thus be disposed to be substantially invisible from the outside. For example, in a state not fully drawn in, a portion of the second supporting member 222 may overlap the first supporting member 212 to be invisible from the outside, and the rest of the second supporting member 222 may be disposed not to overlap the first supporting member 212 to be visible from the outside.

According to an embodiment, the electronic device may include a rear cover 213. The rear cover 213 may be disposed on at least a portion of the first housing 210, on the rear surface 200b of the electronic device. The rear cover 213 may be disposed through at least a portion of, e.g., the first supporting member 212. The rear cover 213 may be formed integrally with, e.g., the first side member 211. The rear cover 213 may be formed of, e.g., polymer, laminated or colored glass, ceramic, metal (e.g., aluminum, stainless steel (STS), or magnesium), or a combination of at least two thereof. The rear cover 213 may extend, e.g., to at least a portion of the first side member 211. At least a portion of the first supporting member 212 may be replaced with, e.g., the rear cover 213. The electronic device 200 may further include another rear cover (e.g., second rear cover) which is disposed on, or replaced with, at least a portion of the second supporting member 222, in the second housing 220.

According to an embodiment, the electronic device 200 may include a flexible display 230 disposed to be supported by at least a portion of the first housing 210 or the second housing 220. The flexible display 230 may include a first area 230a (e.g., flat portion) or a second area 230b (e.g., a bent portion, a bendable portion, or a rolling portion). The first area 230a may be an area that is always visible from the outside of the entire area of the flexible display 230. During draw-in, the second area 230b which may extend from the first area 230a may be received into the first receiving portion 2101 of the first housing 210 or the second receiving portion 2201 of the second housing 220 to be invisible from the outside and, during draw-out, drawn out of the first receiving portion 2101 or second receiving portion 2201 to be visible from the outside. The first area 230a may be disposed to be supported by the first housing 210. The second area 230b may be disposed to be at least partially supported by a bendable member (e.g., the bendable member 240 of FIG. 4). The area drawn out of the first receiving portion 2101 or second receiving portion 2201, of the first area 230a or the second area 230b, may be activated to display an image, and the area received in the first receiving portion 2101 or second receiving portion 2201, of the second area 230b may be deactivated not to display an image.

According to an embodiment, the second area 230b of the flexible display 230 may extend from the first area 230a while being supported by the bendable member (e.g., the bendable member 240 of FIG. 4) in a state in which the second housing 220 has been drawn out along a designated direction (① direction). To this end, the second area 230b may form substantially the same plane as the first area 230a and may be disposed to be visible from the outside.

According to an embodiment, the second area 230b of the flexible display 230 may be received in the second receiving portion 2201 of the second housing 220 to be invisible from the outside or to be invisible from the front while being visible from the back, in a state drawn in along a designated direction (② direction).

According to an embodiment, an opposite end of the variable portion (e.g., second area 230b) of the flexible display 230 may include a fixed portion (e.g., edge portion 231) fixed by the first housing 210. The fixed portion (e.g., edge portion 231) may be formed by being bent from one side of the flexible display 230 to the side surface (e.g., the second side surface 2112) of the first housing 210. The fixed portion (e.g., edge portion 231) may constitute the whole or part of the side surface (e.g., the second side surface 2112) of the first housing 210.

According to an embodiment, the first housing 210 and/or the second housing 220 may be operated to slide on each other so that the entire width is variable. As an example, in the closed state, the electronic device 200 may be configured to have a first width W1 between the second side surface 2112 and the fourth side surface 2211. Further, in the open state, the electronic device 200 may be configured to have a third width W3 larger than the first width W1 as at least a portion of the bendable member (e.g., the bendable member 240 of FIG. 4) received in the second receiving portion 2201 of the second housing 220 is moved to have an additional second width W2. In the closed state, the flexible display 230 included in the electronic device 200 may have a display area substantially corresponding to the first width W1 and, in the open state, have an extended display area substantially corresponding to the third width W3.

According to an embodiment, the draw-in and/or draw-out of the electronic device 200 may be automatically performed. The electronic device 200 may receive, e.g., a draw-in or draw-out request and operate the driving module (e.g., the driving module 400 of FIG. 4) disposed therein. The draw-in or draw-out request may be performed through a designated operation button disposed in the electronic device 200 and/or through a touch to a corresponding object displayed on the flexible display 230. As an example, upon detecting a draw-in and/or draw-out event, the processor (e.g., the processor 120 of FIG. 1) of the electronic device 200 may operate to control the slide of the second housing 220 through the driving module 400. The processor (e.g., the processor 120 of FIG. 1) of the electronic device 200 may operate to control the display screen of the flexible display 230 to execute an application program or display an object in various manners, corresponding to the changed display area of the flexible display 230 according to, e.g., the closed state, open state, or intermediate state (including, e.g., a free stop state). Each processor herein includes processing circuitry.

According to an embodiment, the electronic device 200 may include at least one of an input device (e.g., the microphone 203), a sound output device (e.g., the receiver 206 for phone calls or speaker 207), sensor modules 204 and 217, a camera module (the first camera module 205 or second camera module 216), a connector port 208, a key input device (not shown), or an indicator (not shown), disposed in the first receiving portion 2101 of the first housing 210. The electronic device 200 may be configured to omit at least one of the above-described components or add other components. At least one of the above-described components may be disposed in the second receiving portion 2201 of the second housing 220. Each "module" herein may include circuitry.

According to an embodiment, the input device may include a plurality of microphones disposed to detect the direction of sound. The sound output device may include, e.g., the receiver 206 for phone calls and the speaker 207. In the open state, the speaker 207 may be disposed to face the outside through at least one speaker hole formed in the first housing 210. The connector port 208 may be disposed to face the outside through the connector port formed in the first housing 210. The receiver 206 for phone calls may include a speaker (e.g., a piezo speaker) operated without a separate speaker hole.

According to an embodiment, the sensor modules 204 and 217 (including respective sensors) may generate an electrical signal or data value corresponding to an internal operating state or external environmental state of the electronic device 200. The sensor modules 204 and 217 may include a first sensor module 204 (e.g., proximity sensor or illuminance sensor) disposed on the front surface 200a of the electronic device 200 and/or a second sensor module 217 (e.g., hear rate monitoring (HRM) sensor) disposed on the rear sensor 200b. The first sensor module 204 may be disposed under the flexible display 230, e.g., on the front surface 200a of the electronic device 200. The first sensor module 204 and/or the second sensor module 217 may include at least one of a proximity sensor, an illuminance sensor, a time of flight (TOF) sensor, an ultrasonic sensor, a fingerprint recognition sensor, a gesture sensor, a gyro sensor, an air pressure sensor, a magnetic sensor, an accelerometer, a grip sensor, a color sensor, an infrared (IR) sensor, a biometric sensor, a temperature sensor, or a humidity sensor.

According to an embodiment, the camera module may include a first camera module 205 disposed on the front surface 200a of the electronic device 200 and a second camera module 216 disposed on the rear surface 200b. Each camera module include at least one camera. The first and/or second camera module 205 and 216 may include one or more lenses, an image sensor, and/or an image signal processor. For example, the first camera module 205 may be disposed under the flexible display 230 and be configured to capture a subject through a portion of the active area of the flexible display 230. The flash 218 may be disposed on the second camera module 216. The flash 218 may include, e.g., a light emitting diode (LED) or a xenon lamp.

According to an embodiment, the first camera module 205 among the camera modules or some sensor module 204 among the sensor modules 204 and 217 may be disposed to detect the external environment through the flexible display 230. For example, the first camera module 205 or some sensor module 204 may be disposed to contact the external environment through an opening or a transmissive area formed in the flexible display 230, in the first receiving portion 2101 of the first housing 210. The area of the flexible display 230 facing the first camera module 205 may be a portion of the area displaying content and be formed as a transmissive area having a designated transmittance. The transmissive area may be formed to have a transmittance ranging from about 5% to about 20%. The transmissive area may include an area overlapping an effective area (e.g., an angle-of-view area) of the first camera module 205 through which light incident on the image sensor to obtain an image passes. For example, the transmissive area of the flexible display 230 may include an area having a lower pixel density and/or wiring density than the surrounding area. The transmissive area may replace the above-described opening. The camera module 205 may include an under display camera (UDC). The sensor module 204 may be disposed to perform its functions without being visually exposed through the flexible display 230 in the internal space of the electronic device 200.

According to an embodiment, the electronic device 200 may include at least one antenna (e.g., antenna radiator) A1, A2, and A3 electrically connected with the wireless communication circuit (e.g., the wireless communication module 192 of FIG. 1, including communication circuitry) disposed in the first receiving portion 2101 of the first housing 210. The at least one antenna A1, A2, and A3 may include at least one of a first antenna A1 disposed on the first side surface 2111 of the first housing 210, a second antenna A1 disposed on the second side surface 2112, and a third antenna A3 disposed on the third side surface 2113. The electronic device 200 may further include at least one antenna disposed on the fifth side surface 2212 of the second housing 220.

According to an embodiment, in the electronic device 200, the first antenna A1 may include a first conductive portion 311 segmented through at least one segmenter 3111 and 3112 which is a non-conductive portion, on the first side surface 2111 of the first side member 211. The first conductive portion 311 may be disposed to be segmented through a first segmenter 3111 and/or a second segmenter 3112 spaced apart from each other at a designated interval and be electrically connected with the wireless communication circuit (e.g., the wireless communication module 192 of FIG. 1).

According to an embodiment, in the electronic device 200, the second antenna A2 may include a second conductive portion 321 segmented through at least one segmenter 3211 and 3212 which is a non-conductive portion, on the second side surface 2112 of the first side member 211. The second conductive portion 321 may be disposed to be segmented through a third segmenter 3211 and/or a fourth segmenter 3212 spaced apart from each other at a designated interval and be electrically connected with the wireless communication circuit (e.g., the wireless communication module 192 of FIG. 1).

According to an embodiment, in the electronic device 200, the third antenna A3 may include a third conductive portion 331 segmented through at least one segmenter 3311 and 3312 which is a non-conductive portion, on the third side surface 2113 of the first side member 211. The third conductive portion 331 may be disposed to be segmented through a fifth segmenter 3311 and/or a sixth segmenter 3312 spaced apart from each other at a designated interval and be electrically connected with the wireless communication circuit (e.g., the wireless communication module 192 of FIG. 1 including communication circuitry).

According to an embodiment, the wireless communication circuit (e.g., the wireless communication module 192 of FIG. 1) in the electronic device 200 may be configured to transmit and/or receive a wireless signal in a designated first frequency band (e.g., about 800 MHz to 6000 MHZ) through the first conductive portion 311, the second conductive portion 321, and/or the third conductive portion 331. The wireless communication circuit (e.g., the wireless communication module 192 of FIG. 1) in the electronic device 200 may be configured to transmit and/or receive a wireless signal in a second frequency band (e.g., about 3 GHz to 100 GHz). The electronic device 200 may further include at least one antenna module for transmitting and/or receiving a signal of a first frequency band or at least one antenna module (e.g., 5G antenna module or antenna structure) for transmitting and/or receiving a signal of the second frequency band.

According to various embodiments, the electronic device 200 may include a driving module (e.g., the driving module 400 of FIG. 4) in an inner space for draw-in and/or draw-out. The driving module 400 may be disposed considering the relationship with other electronic components in the inner space of the electronic device 200, thereby contributing to slimming down the electronic device 200. Each embodiment herein may be used in combination with any other embodiment herein.

Figure 4:
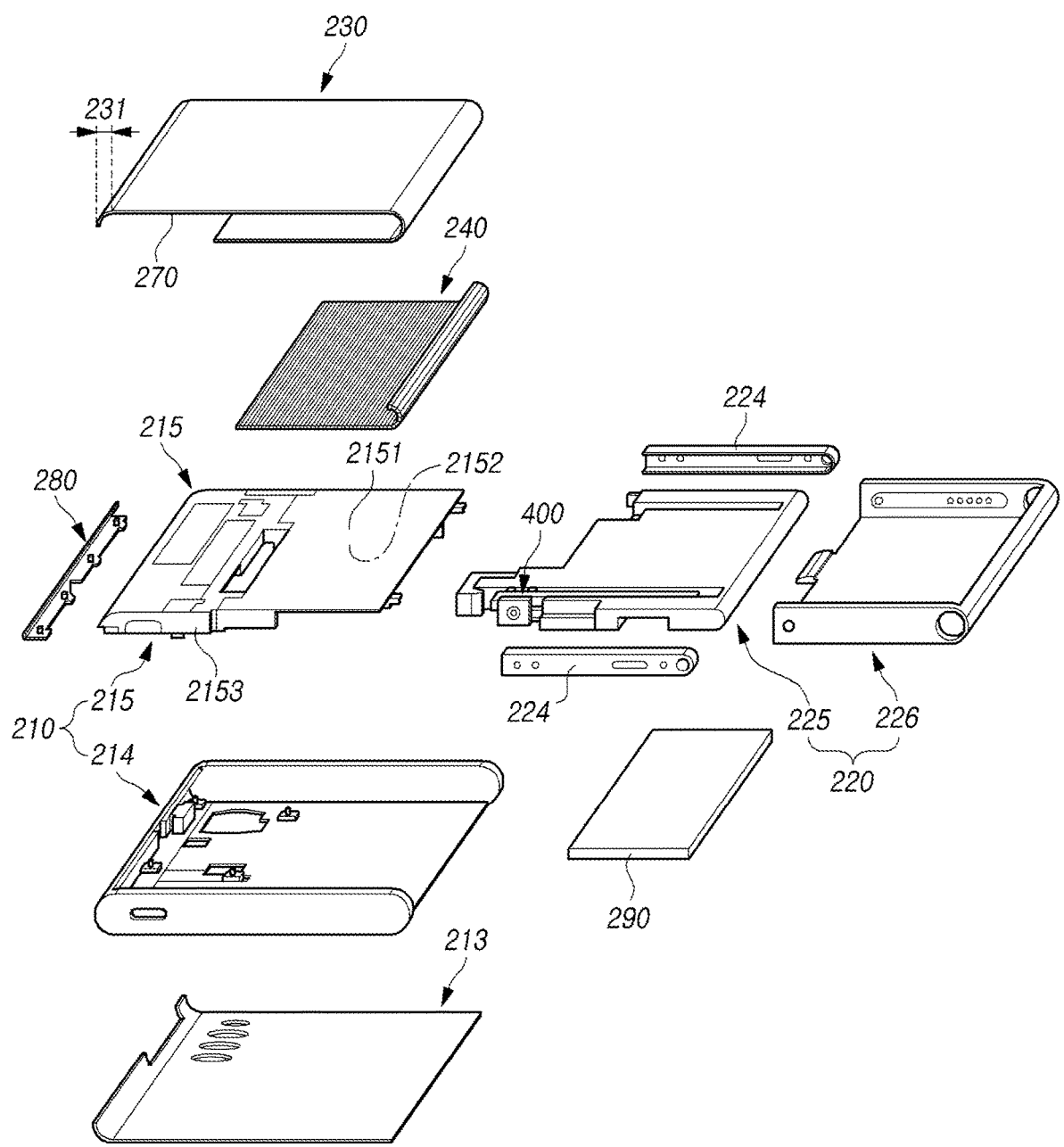
FIG. 4 is an exploded perspective view illustrating an electronic device according to an example embodiment.
Figure 5A:
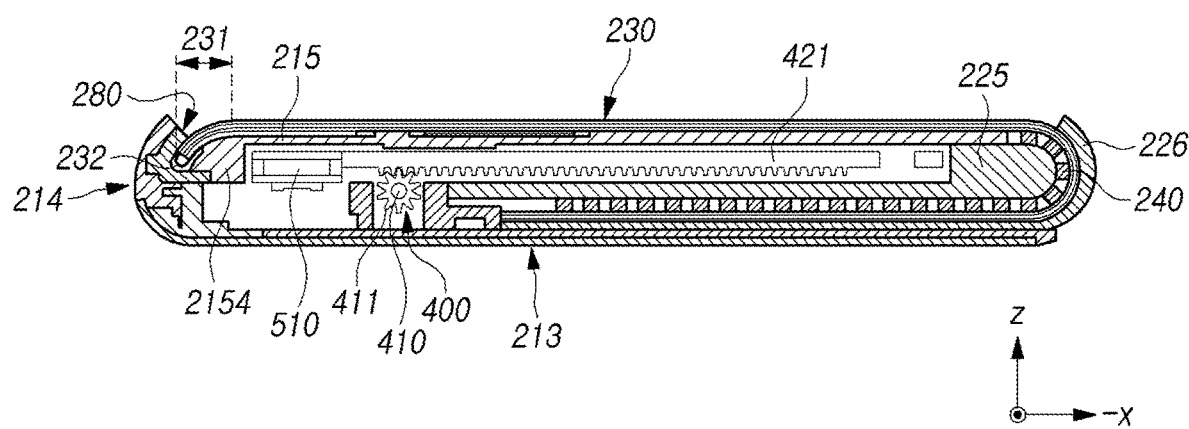
FIG. 5A is a cross-sectional view of the electronic device, taken along line 5a-5a of FIG. 2A according to an example embodiment.
Figure 5B:
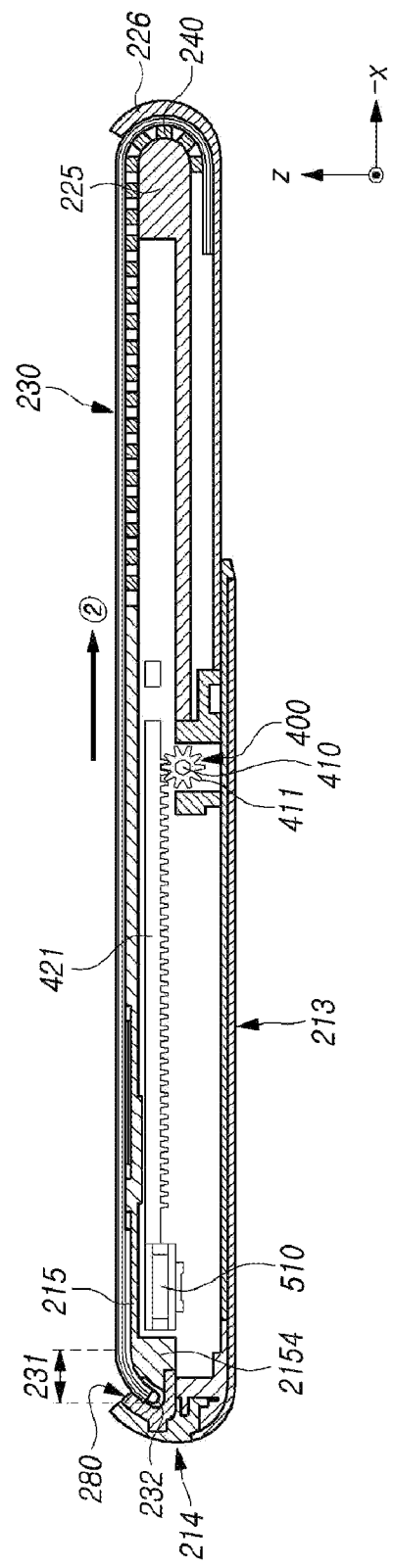
FIG. 5B is a cross-sectional view of the electronic device, taken along line 5b-5b of FIG. 3A according to an example embodiment.

FIG. 4 is an exploded perspective view illustrating an electronic device (e.g., the electronic device 200 of FIGS. 2A to 3B) according to an embodiment. FIG. 5A is a cross-sectional view illustrating an electronic device (e.g., the electronic device 200 of FIGS. 2A to 3B), taken along line 5a-5a of FIG. 2A, according to an embodiment. FIG. 5B is a cross-sectional view illustrating an electronic device (e.g., the electronic device 200 of FIGS. 2A to 3B), taken along line 5b-5b of FIG. 3A, according to an embodiment.

Referring to FIGS. 4 to 5B, the electronic device 200 may include a display protective cover member configured to protect the edge portion 231 of the display including a plurality of layers when the flexible display is drawn in and/or drawn out. According to an embodiment, the display protective cover member may have a structure, or be disposed, to cover the edge portion 231 of the display and at least a portion of the supporting member to which at least a portion of one end (e.g., extension 232) of the flexible display is attached.

According to an embodiment, the electronic device 200 may include a first housing 210 including a first receiving unit/portion 2101, a second housing 220 including a second receiving unit/portion 2201, and a bendable member 240 (e.g., a multi-bar assembly), or a flexible display 230. The first housing 210 may be slidably coupled to the second housing 220. The bendable member 240 may be disposed to be at least partially pivotable in the second receiving portion 2201. The flexible display 230 may be disposed to be supported by at least a portion of the bendable member 240 and the first housing 210.

According to an embodiment, the first housing 210 may include at least one of a cover housing 214 or a bracket housing 215. The first housing 210 may be provided, e.g., by coupling the cover housing 214 and the bracket housing 215. At least a portion of the cover housing 214 may include, or be replaced with, a first supporting member (e.g., the first supporting member 212 of FIG. 3B). The bracket housing 215 may include a first surface 2151 facing in a second direction (e.g., z axis direction), a second surface 2152 facing in a third direction (e.g., -z axis direction) opposite to the first surface 2151, and a side surface 2153 surrounding the space between the first surface 2151 and the second surface 2152. According to an embodiment, the electronic device 200 may include an auxiliary cover that is disposed on at least a portion of the first surface 2151 of the bracket housing 215 under the flexible display 230 to provide a flat surface.

According to an embodiment, the electronic device 200 may include a substrate (not shown) or at least one battery 290 disposed in the first receiving portion 2101 between the cover housing 214 and the second surface 2152 of the bracket housing 215. The substrate or the at least one battery 290 may be attached to the bracket housing 215.

According to an embodiment, the electronic device 200 may include at least one of a camera module (e.g., the camera module 216 of FIG. 3A) or a sensor module (e.g., the sensor module 217 of FIG. 3A) disposed in the first receiving unit 2101.

According to an embodiment, the bendable member 240 may be attached to at least a portion of the rear surface of the flexible display 230. At least a portion of the bendable member 240 may be received to be movable in the second receiving unit 2201 of the second housing 220. The bendable member 240 may be at least partially received in the second receiving unit 2201 in the closed state. In the open state, the bendable member may be at least partially drawn out of the second receiving unit 2201 to be substantially flush with the first housing 210 (e.g., the bracket housing 215). The flexible display 230 supported by at least a portion of the first housing 210 or the bendable member 240 may have a variable display area which is visible from the outside according to a slide.

According to an embodiment, the electronic device 200 may include at least one guide rail 224 disposed between the first housing 210 and the second housing 220 to induce a slide of the second housing 220. The guide rail 224 may be integrally formed with the second housing 220 (e.g., the sliding frame 225 or the slide cover housing 226). The guide rail 224 may guide the movement of the bendable member 240. According to an embodiment, the electronic device 200 may further include a side cover (not shown) disposed to cover two opposite sides (e.g., the first side surface 2111 and the third side 2113 of FIG. 2A) of the first housing 210.

According to an embodiment, the second housing 220 may include a sliding frame 225 or a slide cover housing 226. The sliding frame 225 may be disposed to be at least partially movable from the first housing 210 to the second receiving unit 2201 (direction ①). For example, the sliding frame 225 may be coupled to the slide cover housing 226 and may be slidably coupled to the first housing 210 (e.g., the bracket housing 215). As another example, the sliding frame 225 may be integrally formed with the slide cover housing 226. If the slide cover housing 226 includes the structure of the sliding frame 225, the sliding frame 225 may not be included as a separate component.

According to an embodiment, the electronic device 200 may include a driving module 400. The driving module 400 may be disposed in an inner space (e.g., the first receiving unit 2101 or the second receiving unit 2201). The driving module 400 may provide a driving force for moving the second housing 220 in a direction in which the second housing 220 is drawn out from the first housing 210 (direction ①) and/or in a direction in which the second housing 220 is drawn in (direction ②). The driving module 400 may be disposed in, e.g., the second housing 220 (e.g., the sliding frame 225).

According to an embodiment, the driving module 400 may include a driving motor 410, a first gear 411 (e.g., a pinion gear) mounted on the driving motor 410, and a second gear 421 (e.g., a rack gear) engaged with the first gear 411. The driving motor 410 may move together with the sliding frame 225 when the electronic device 200 is drawn in and/or out.

According to an embodiment, the driving module 400 may be disposed in the sliding frame 225 and be positioned on the same plane as the sliding frame 225. The driving module 400 may relatively reduce the thickness of the electronic device 200 to contribute to slimming down the electronic device 200, as compared to when it is disposed above or under the sliding frame 225.

According to an embodiment, in the electronic device 200, as the driving motor 410 is driven, the second gear 421 linearly moves, inducing draw-in or draw-out. Specifically, the second gear 421 pushes a portion of the first housing 210 or an electronic component in the first receiving unit 2101 to move the sliding frame 225 in the direction ② (e.g., -x axis direction), so that the flexible display 230 may be drawn out.

According to an embodiment, the electronic device 200 further may include a protective cover 280 disposed between the first housing (e.g., the cover housing 214) and the flexible display 230 to protect the flexible display 230. The protective cover 280 may be provided, e.g., between the second side surface 2112 of the cover housing 214 and the side surface 2153 of the bracket housing 215. The protective cover 280 may protect the fixed portion (e.g., edge portion 231) of the flexible display 230 from external impact and be configured so that two opposite sides of the segmenter (e.g., the third segmenter 3211 or fourth segmenter 3212) provided on the side surface (e.g., the second side 2112) of the first housing 210 are not parted. The protective cover 280 may be integrally formed with the first housing 210 (e.g., the bracket housing 215).

According to an embodiment, a support sheet 270 may be attached to the rear surface of the flexible display 230. The rear surface of the flexible display 230 may indicate a surface positioned opposite to a surface from which light is emitted from the display panel (e.g., the display panel 610 of FIG. 6A) including a plurality of pixels. The support sheet 270 may contribute to durability of the flexible display 230. The support sheet 270 may reduce the effect on the flexible display 230 by the load or stress that may occur when the flexible display 230 is drawn in/out. The support sheet 270 may prevent or reduce the likelihood of damage to the flexible display 230 by the force transferred when the sliding frame 225 is moved.

According to an embodiment, the support sheet 270 may be formed of various metal materials and/or non-metal materials (e.g., polymers). The support sheet 270 may include, e.g., stainless steel. The support sheet 270 may include, e.g., engineering plastic. The support sheet 270 may be implemented integrally with the flexible display 230.

According to an embodiment, the support sheet 270 prevents or reduces the likelihood of the electronic components (e.g., the bendable member 240) positioned inside the electronic device 200 from being substantially visible from the outside through the flexible display 230.

According to an embodiment, a touch panel or a pen recognition panel may be provided on the support sheet 270. The touch panel may detect the user's finger gesture input and may output a touch event value corresponding to the detected touch signal. The touch panel may be implemented of either a capacitive type or a resistive type. The capacitive type is a scheme for calculating the touch coordinates by detecting micro electricity generated in the user's body. The resistive type is a type in which includes two electrode plates embedded in the touch panel to calculate the touch coordinates by detecting a current flow generated as the upper and lower plates of the touched point contact. The pen recognition panel may detect the user's pen gesture input according to the operation of the user's touch pen (e.g., stylus pen or digitizer pen) of the user and output a pen proximity event value or pen touch event value. The pen recognition panel may be implemented, e.g., in an EMR (Electro-Magnetic Resonance) type and may sense a touch or proximity input by a change in electromagnetic field due to the approach and/or touch of the touch pen.

Figure 6A:
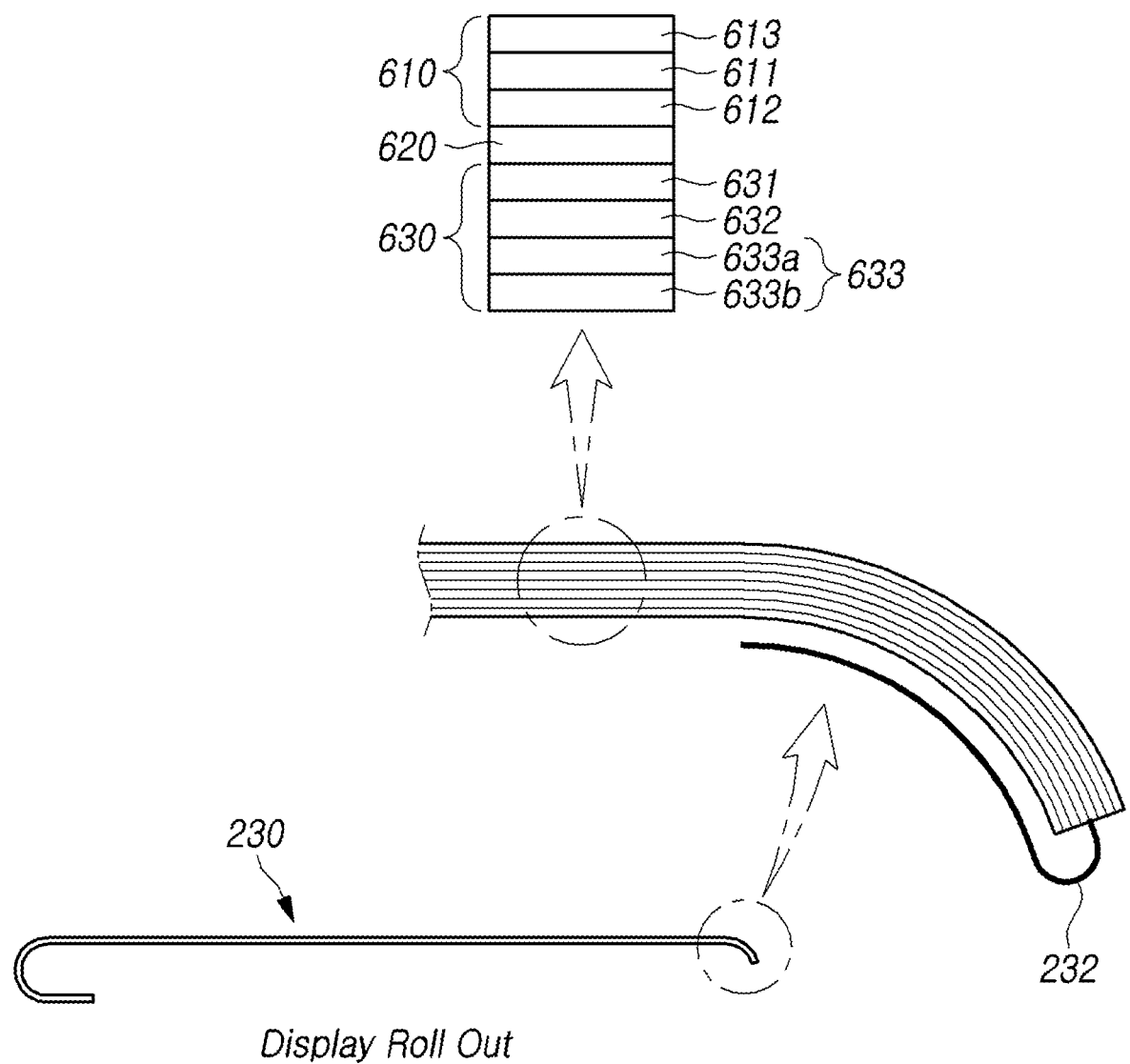
FIG. 6A is a side view illustrating a flexible display in an electronic device in an open state according to an example embodiment.
Figure 6B:
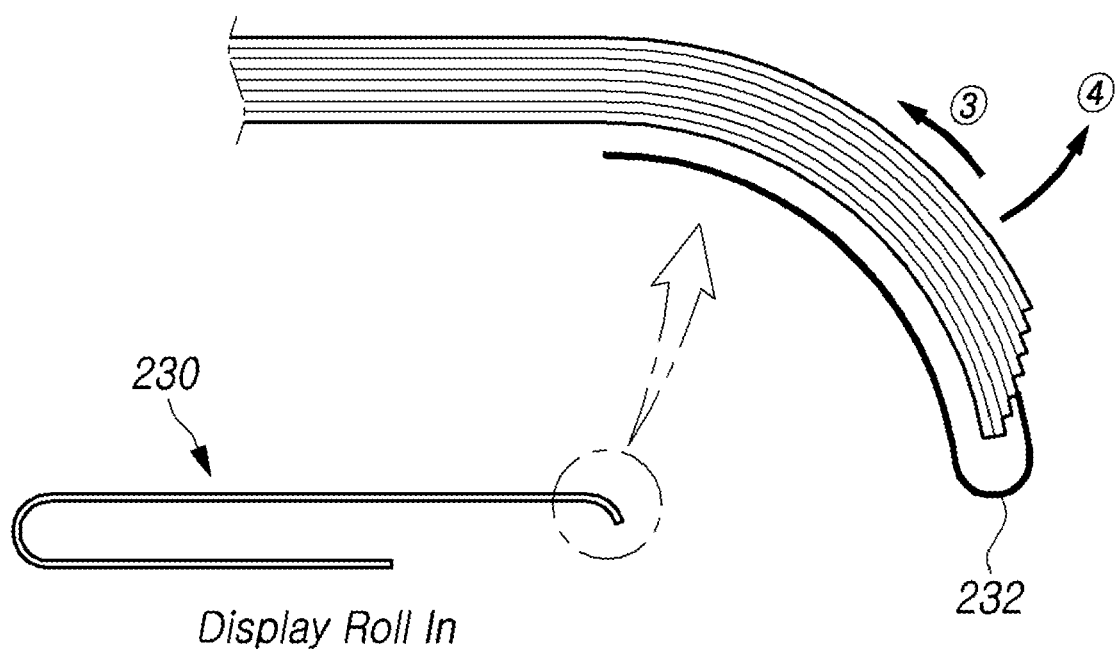
FIG. 6B is a side view illustrating a flexible display in an electronic device in a closed state according to an example embodiment.

FIG. 6A is a side view illustrating a flexible display in an electronic device in an open state according to an embodiment. FIG. 6B is a side view illustrating a flexible display in an electronic device in a closed state according to an embodiment.

Referring to FIGS. 6A and 6B, the flexible display 230 may include a plurality of layers stacked and attached, a fixed portion (e.g., edge portion 231) fixed by the first housing 210, and/or an extension 232. An adhesive member (not shown) may be disposed between the plurality of layers included in the flexible display 230 to adhere the layers to each other. According to an embodiment, the flexible display 230 may include a display panel 610, a base film 620, and/or a lower panel 630. The display panel 610 may include a light emitting layer 611, a thin film transistor (TFT) film 612, and/or an encapsulation layer 613. According to an embodiment, at least one additional polymer layer (e.g., a layer including PI, PET, or TPU) other than the base film 620 may be further disposed on the rear surface of the display panel 610. The light emitting layer 611 may include a plurality of pixels implemented as light emitting elements, such as OLEDs or micro LEDs. The light emitting layer 611 may be disposed on the TFT film 612 through organic material evaporation. The TFT film 612 may be positioned between the light emitting layer 611 and the base film 620. The TFT film 612 may refer to a structure in which at least one TFT is disposed on a flexible substrate (e.g., a PI film) through a series of processes, such as deposition, patterning, and etching. The at least one TFT may control the current to the light emitting element of the light emitting layer 611 to turn on or off the pixel or adjust the brightness of the pixel. The at least one TFT may be implemented as an amorphous silicon (a-Si) TFT, a liquid crystalline polymer (LCP) TFT, a low-temperature polycrystalline oxide (LTPO) TFT, or a low-temperature polycrystalline silicon (LTPS) TFT. The encapsulation layer (e.g., thin-film encapsulation (TFE)) 613 may seal the light emitting layer 611 to prevent or reduce the likelihood of penetration of oxygen and/or moisture into the OLED.

According to an embodiment, the base film 620 may include a flexible film formed of a material, such as polyimide or polyester. The base film 620 may serve to support and protect the display panel 610. The base film 620 may be referred to as a protective film, a back film, or a back plate. The base film 620 may be positioned between the display panel 610 and the lower panel 630.

According to an embodiment, the lower panel 630 may include a plurality of layers for various functions. The lower panel 630 may include a light blocking layer 631, a buffer layer 632, or a lower layer 633. For example, the light blocking layer 631, the buffer layer 632, or the lower layer 633 may be sequentially positioned in order from the base film 620. The light blocking layer 631 may block light incident from the outside. For example, the light blocking layer 631 may include an embossed layer. The embossed layer may be a black layer including an uneven pattern. The buffer layer 632 may alleviate the external impact applied to the flexible display 230. For example, the buffer layer 632 may include a sponge layer or a cushion layer. The lower layer 633 may diffuse, disperse, and/or radiate the heat generated in the electronic device 200 and/or the flexible display 230. The lower layer 633 may absorb and/or shield electromagnetic waves. The lower layer 633 may mitigate the external impact applied to the electronic device 200 and/or the flexible display 230. The lower layer 633 may include a composite sheet 633a or a copper sheet 633b. The composite sheet 633a may include at least one of polyimide or graphite. The composite sheet 633a may be replaced with a single sheet including one material (e.g., polyimide or graphite). The composite sheet 633a may be positioned between the buffer layer 632 and the copper sheet 633b. The lower layer 633 may include various other layers for various functions.

According to an embodiment, at least one of the plurality of layers (e.g., the light blocking layer 631, the buffer layer 632, the composite sheet 633a, and the copper sheet 633b) included in the lower panel 630 may be omitted. According to various embodiments, the arrangement order of the plurality of layers included in the lower panel 630 is not limited to the embodiment of FIG. 6B, and various changes may be made thereto.

According to an embodiment, at least some of the plurality of layers included in the lower layer 633 may include an opening formed corresponding to a sensor (e.g., a fingerprint sensor) positioned inside the electronic device 200. The sensor may overlap the opening or may be at least partially inserted into the space of the opening.

According to an embodiment, the extension 232 extends from the fixing portion (e.g., the edge portion 231) and is bent with a predetermined curvature, electrically connecting the display driving chip (DDI) (display driver IC) with the flexible printed circuit board (FPCB) (not shown) positioned on the rear surface of the flexible display 230. The display driving chip may be provided on the extension 232, for example.

The extension 232 may be provided by, e.g., one of a chip-on-film (COF) scheme or a chip-on-plastic (COP) scheme, but is not limited thereto.

The chip-on-film scheme is a scheme in which the display driving chip is mounted on a film substrate that connects a display glass substrate and a flexible printed circuit board. When the extension 232 is provided by a chip-on-film scheme, the extension 232 may be electrically connected to the flexible printed circuit board based on anisotropic conductive film (ACF) bonding. The ACF may be an anisotropic conductive film formed by mixing fine conductive particles (e.g., nickel, carbon, or solder balls) with an adhesive resin (e.g., thermosetting resin) to allow current to flow only in one direction. If the ACF is disposed between the extension 232 and the flexible printed circuit board (not shown) positioned on the rear surface of the flexible display 230 and is then compressed by heat and pressure, the conductive pattern (not shown) formed on the extension 232 may be electrically connected to the conductive pattern formed on the flexible printed circuit board. In this case, the adhesive resin may bond the extension 232 and the flexible printed circuit board. The electrical paths included in the extension 232 may electrically connect at least one layer (e.g., TFT film) and the flexible printed circuit board. For example, the electrical paths may be formed on the TFT film 612 based on LTPS, LTPO, or a-Si together with the TFT.

The chip-on-plastic scheme is a scheme for mounting a display driving chip on a flexible polyimide (PI) substrate used as a display substrate. When the extension 232 is provided by a chip-on-plastic scheme, the extension 232 may be formed to extend from the base film 620.

According to an embodiment, each of the layers of the flexible display 230 may slip from its adjacent layers when the flexible display 230 is drawn in and/or out. Specifically, as the flexible display 230 rolls, the layer positioned higher may further slip from the fixed portion (e.g., edge portion 231) to the flat portion (e.g., the first area 230a of FIG. 2A) (e.g., direction ③). As the layers are misaligned at the fixed portion (e.g., edge portion 231) due to the slip between the plurality of layers as shown in FIG. 6B, the fixed portion (e.g., edge portion 231) may be bent in the opposite direction (e.g., direction ④) from the bent direction, causing a peel-off. When a peel-off occurs at the fixed portion (e.g., edge portion 231), the extension 232 may contact its surrounding first housing (e.g., the bracket housing 215 of FIG. 4 or the cover housing 214 of FIG. 4), thus damaging the extension 232. Or, as a peel-off occurs at the fixed portion (e.g., edge portion 231), the spacing between the flexible display 230 and the antenna (e.g., the second antenna A2 of FIG. 2A) disposed on the side surface (e.g., the second side surface 2112 of FIG. 2A) of the first housing 210 (e.g., the cover housing 214 of FIG. 4) is narrowed, deteriorating the communication performance of the antenna (e.g., the second antenna A2 of FIG. 2A). According to various embodiments, the electronic device 200 is provided with the protective cover 280 to be described below in detail, thereby preventing or reducing the likelihood of a peel-off at the fixed portion (e.g., edge portion 231) and maintaining the spacing between the antenna (e.g., the second antenna A2 in FIG. 2A) and the fixed portion (e.g., edge portion 231) regardless of draw-in or draw-out while preventing or reducing damage to the extension 232.

Figure 7:
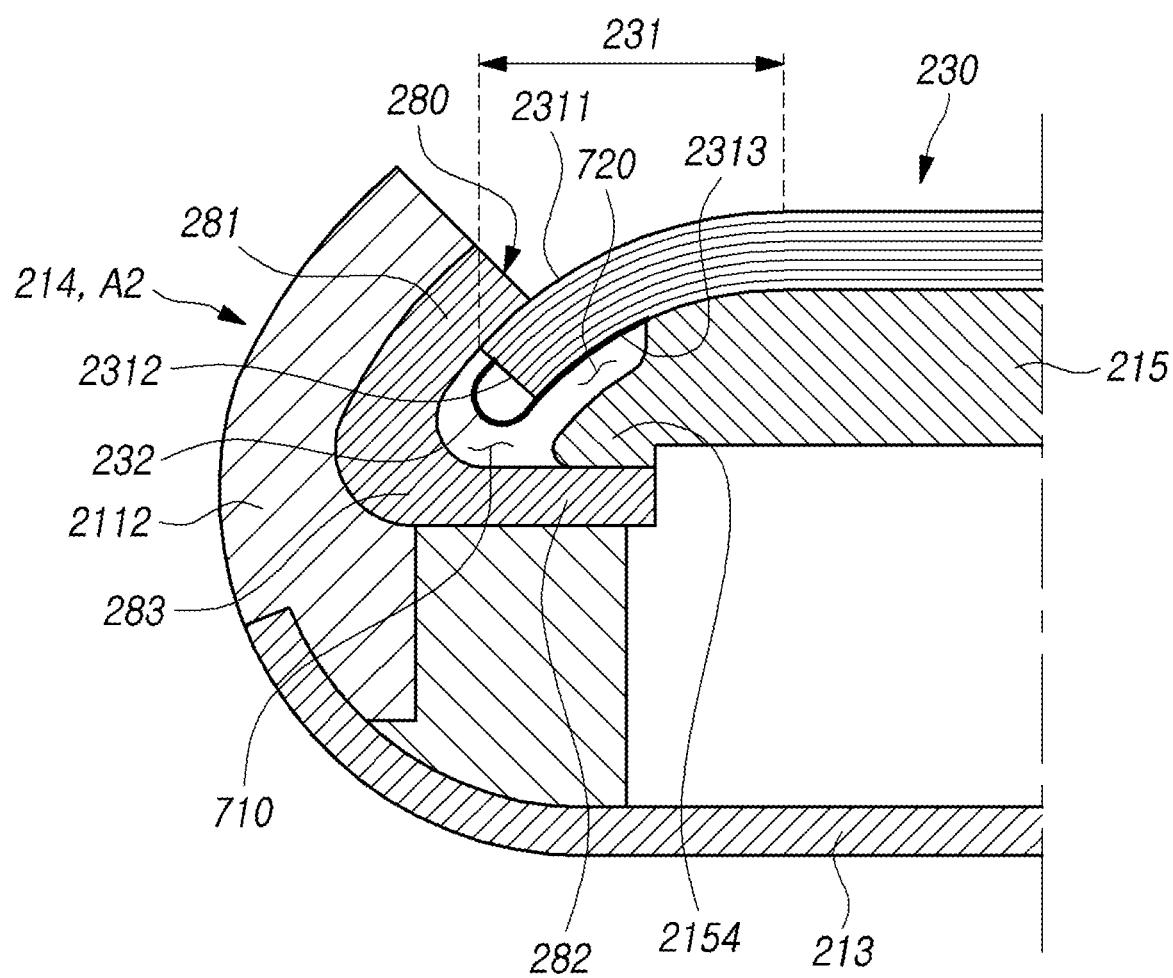
FIG. 7 is an enlarged cross-sectional view illustrating a protective cover and its surrounding components in an electronic device according to an example embodiment.

FIG. 7 is an enlarged cross-sectional view illustrating a protective cover and its surrounding components in an electronic device according to an embodiment.

Referring to FIG. 7, an electronic device 200 may include a first housing 210, a second housing 220, a flexible display 230, and/or a protective cover 280. The illustrated configuration of the first housing 210, the second housing 220, the flexible display 230, or the protective cover 280 may be identical in whole or part to the configuration of the first housing 210, the second housing 220, the flexible display 230, and the protective cover 280 of FIGS. 2 to 4.

According to an embodiment, the protective cover 280 may include a first portion 281, a second portion 282, and/or a curved portion 283. A portion of the first portion 281 of the protective cover 280 may contact the flexible display 230. The second portion 282 of the protective cover 280 may contact the first housing 210 (e.g., the bracket housing 215). The first portion 281 and the outer surface of the curved portion 283 of the protective cover 280 may contact a side surface (e.g., the second side surface 2112) of the first housing 210 (e.g., the cover housing 214).

According to an embodiment, the protective cover 280 may be provided between the first housing 210 and the flexible display 230. The protective cover 280 may be disposed such that a portion thereof contacts at least a portion of the upper portion 2311 of the edge portion 231. Specifically, the protective cover 280 may be disposed such that a portion of the first portion 281 contacts at least a portion of the upper portion 2311 of the edge portion 231. As a portion of the upper portion 2311 of the edge portion 231 contacts the protective cover 280, it is possible to prevent or reducing a peel-off at the edge portion 231 caused when the flexible display 230 is drawn in/out.

According to an embodiment, the protective cover 280 and a portion of the upper portion 2311 of the edge portion 231 are not attached to each other, and the protective cover 280 presses the upper portion 2311 of the edge portion 231 to fix the edge portion 231. In other words, even when the protective cover 280 and the upper portion 2311 of the edge portion 231 contact each other, each layer may slip at the edge portion 231. In this case, the outermost layer (e.g., the encapsulation layer 613 of FIG. 6A) of the layers of the flexible display 230 may be slipped, with a portion thereof in contact with the protective cover 280.

According to an embodiment, a first space 710 may be formed between the protective cover 280 and the side portion 2312 of the edge portion 231. The first space 710 may be formed in a size in which the extension 232 positioned at the side portion 2312 of the edge portion 231 may be spaced apart from the protective cover 280. Here, the first space 710 may denote a space provided to prevent or reduce contact between the protective cover 280 and the extension 232 that is moved together as each layer of the flexible display 230 is slipped when the flexible display 230 is drawn in/out. Accordingly, while the flexible display 230 is drawn in and/or out, the extension 232 may be moved in the first space 710.

According to an embodiment, as the first space 710 is provided in the electronic device 200, the side portion 2312 of the edge portion 231 and/or the extension 232 may be protected from external impact. Specifically, as the first space 710 is provided, an external impact may not be directly transferred to the display driving chip provided on the side portion 2312 of the edge portion 231 and/or the extension 232. Accordingly, as the first space 710 is provided, it is possible to prevent or reduce damage to the side portion 2312 of the edge portion 231 and/or the extension 232 which is vulnerable to external impact.

According to an embodiment, the second space 720 may be formed between the lower portion 2313 of the edge portion 231 and the first housing 210 (e.g., the bracket housing 215). The second space 720 may be provided so that the slip between the layers may smoothly occur when the flexible display 230 is drawn in and/or out. Or, the second space 720 may be provided so that the impact is not directly transferred to a portion of the extension 232 positioned under the edge portion 231 when there is external impact.

According to an embodiment, the protective cover 280 may be provided in a space between the side surface (e.g., the second side surface 2112 of FIG. 2A) of the cover housing 214 and the bracket housing 215. The curved portion 283 of the protective cover 280 may contact the inner side of the side surface (e.g., the second side surface 2112 of FIG. 2A) of the cover housing 214. The second portion 282 of the protective cover 280 may contact the bracket housing 215. The protective cover 280 may be disposed along the length direction of the side surface (e.g., the second side surface 2112 of FIG. 2A) of the cover housing 214.

According to an embodiment, the bracket housing 215 may include a supporting member 2154 that contacts the protective cover 280 to support the protective cover 280. The protective cover 280 may be seated on an inner surface of a side surface (e.g., the second side surface 2112 of FIG. 2A) of the cover housing 214. The curved portion 283 of the protective cover 280 may be formed to correspond to the shape of the inner side of the cover housing 214. An additional component may be further included between the side surface (e.g., the second side surface 2112 of FIG. 2A) of the cover housing 214 and the protective cover 280.

Figure 8:
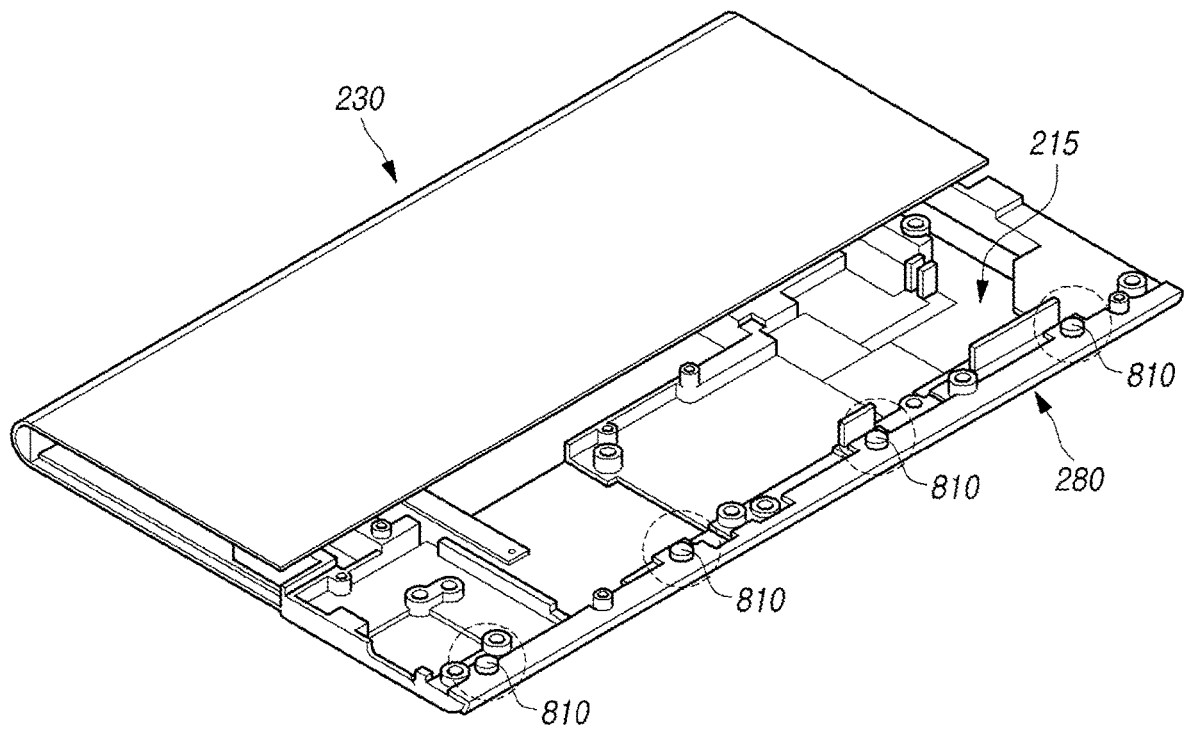
FIG. 8 is a view illustrating a coupling relationship between a protective cover and a first housing (e.g., bracket housing) according to an example embodiment.

FIG. 8 is a view illustrating a coupling relationship between a protective cover and a first housing (e.g., bracket housing) according to an embodiment.

Referring to FIG. 8, an electronic device 200 may include a first housing 210, a second housing 220, a flexible display 230, and/or a protective cover 280. The illustrated configuration of the first housing 210, the second housing 220, the flexible display 230 and/or the protective cover 280 may be identical in whole or part to the corresponding configuration of the first housing 210, the second housing 220, the flexible display 230 and/or the protective cover 280 of FIGS. 2 to 4 and/or FIG. 7.

According to an embodiment, the protective cover 280 may be fixedly coupled to a portion of the first housing 210 (e.g., the bracket housing 215). For example, a portion (e.g., the second portion 282 of FIG. 7) of the protective cover 280 may be coupled to the supporting member 2154. The supporting member 2154 may be formed to support the protective cover 280 on the bracket housing 215. The coupling between the protective cover 280 and the first housing 210 (e.g., the bracket housing 215) may be made by one of schemes, such as screwing, welding, or bonding. As an example, the protective cover 280 may be coupled to the bracket housing 215 using a plurality of screws 810 from under the bracket housing 215 (e.g., the supporting member 2154). As another example, the protective cover 280 may be coupled to the bracket housing 215 by fastening a screw 810 from a side surface of the bracket housing 215 (e.g., the supporting member 2154).

Figure 9A:
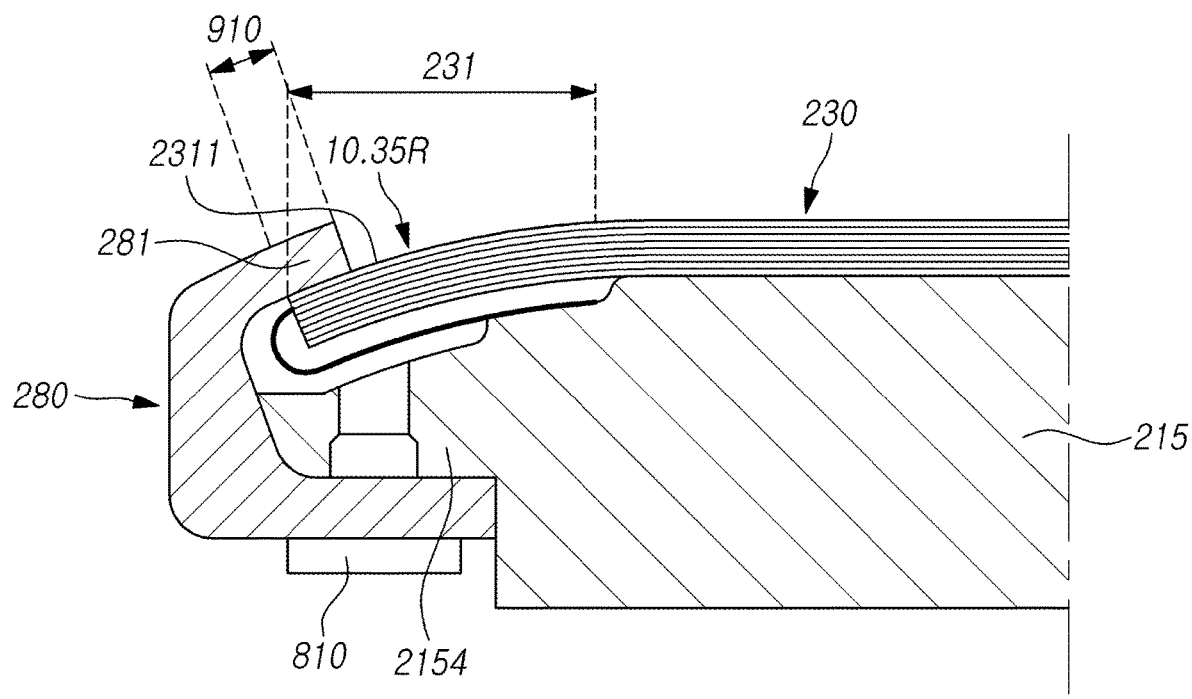
FIGS. 9A and 9B are views illustrating an area in which a fixed portion and a protective cover overlap according to the curvature of the fixed portion (e.g., edge portion) according to various embodiments.
Figure 9B:
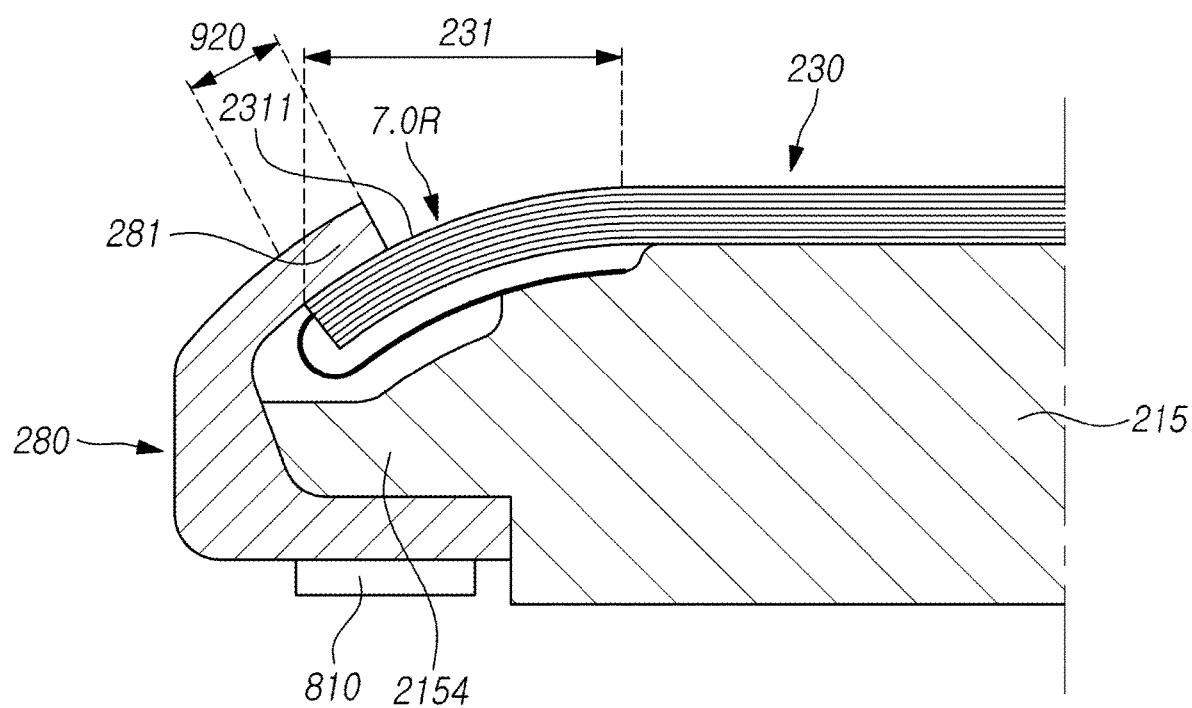

FIGS. 9A and 9B are views illustrating an area in which a fixed portion and a protective cover overlap according to the curvature of the fixed portion (e.g., edge portion) according to various embodiments.

Referring to FIGS. 9A and 9B, an electronic device 200 may include a first housing 210, a second housing 220, a flexible display 230, and/or a protective cover 280. The illustrated configuration of the first housing 210, the second housing 220, the flexible display 230 and/or the protective cover 280 may be identical in whole or part to the configuration of the corresponding first housing 210, the second housing 220, the flexible display 230, and/or the protective cover 280 of FIGS. 2 to 4 and/or FIG. 7.

According to an embodiment, the length (e.g., the first length 910 or the second length 920) at which the protective cover 280 and the upper portion 2311 of the fixing portion (e.g., the edge portion 231) overlap may vary depending on the curvature R of the fixing portion (e.g., the edge portion 231) of the flexible display 230. For example, as the curvature of the fixed portion (e.g., the edge portion 231) increases (or the radius of curvature decreases), that is, as the fixed portion (e.g., the edge portion 231) is more curved, the repulsive force of the fixed portion (e.g., the edge portion 231) may increase. To cover this repulsive force, the length (e.g., the first length 910 or the second length 920) at which the protective cover 280 and the upper portion 2311 of the fixed portion (e.g., the edge portion 231) overlap may increase. For example, as shown in FIG. 9A, when the radius of curvature of the fixed portion (e.g., the edge portion 231) is 10.35 R, the length (e.g., the first length 910) at which the first portion 281 of the protective cover 280 and the upper portion 2311 of the fixed portion (e.g., edge portion 231) overlap may be 1.1 mm. As another example, as shown in FIG. 9B, when the radius of curvature of the fixed portion (e.g., the edge portion 231) is 7.0 R, the length (e.g., the second length 920) at which the first portion 281 of the protective cover 280 and the upper portion 2311 of the fixed portion (e.g., edge portion 231) overlap may be 1.5 mm which is larger than the first length 910.

According to an embodiment, the length (e.g., the first length 910 or the second length 920) at which the protective cover 280 and the upper portion 2311 of the fixing portion (e.g., the edge portion 231) overlap may be determined depending on the number or type of the layers of the flexible display 230.

Figure 10:
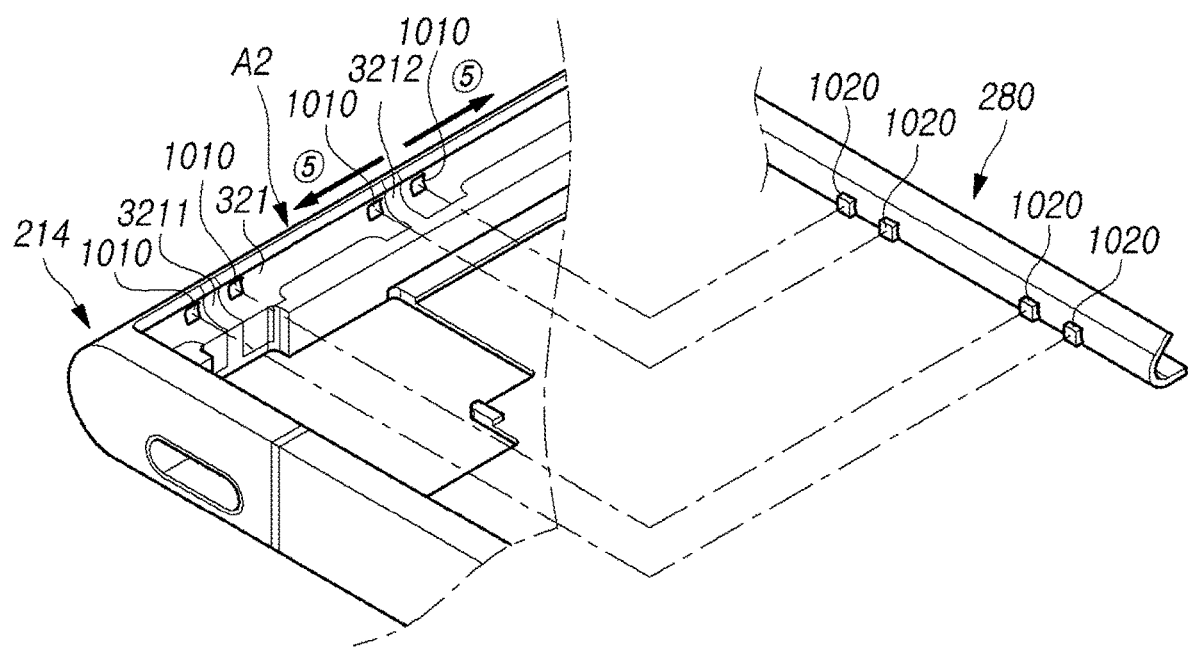
FIG. 10 is a perspective view illustrating a placement relationship between a first housing and a protective cover according to an example embodiment.

FIG. 10 is a perspective view illustrating a placement relationship between a first housing and a protective cover according to an embodiment.

Referring to FIG. 10, an electronic device 200 may include a first housing 210, a second housing 220, a flexible display 230, and/or a protective cover 280. The illustrated configuration of the first housing 210, the second housing 220, the flexible display 230 and/or the protective cover 280 may be identical in whole or part to the configuration of the corresponding first housing 210, the second housing 220, the flexible display 230 and/or the protective cover 280 of FIGS. 2 to 4 and/or FIG. 7.

According to various embodiments, at least one antenna (e.g., second antenna A2) may be provided on a side surface (e.g., second side surface 2112) of the first housing (e.g., the cover housing 214). According to an embodiment, a plurality of recesses (e.g., the recess 1010) and/or a plurality of protrusions may be formed inside the at least one antenna (e.g., the second antenna A2), that is, on the surface contacting the protective cover 280. According to an embodiment, the plurality of recesses (e.g., the recess 1010) and/or the plurality of protrusions of the antenna (e.g., the second antenna A2) may be positioned in a conductive portion (e.g., the second conductive portion 321) of the antenna (e.g., the second antenna A2). At least some of the plurality of protrusions of the antenna (e.g., the second antenna A2) may be formed in the segmenter (e.g., the third segmenter 3211 or the fourth segmenter 3212). According to an embodiment, the protective cover 280 may include a plurality of coupling portions 1020 corresponding to the plurality of protrusions and/or the plurality of recesses (e.g., the recesses 1010) formed in the antenna (e.g., the second antenna A2).

For example, when a plurality of recesses (e.g., the recesses 1010) are formed in the inner surface of the antenna (e.g., the second antenna A2), the protective cover 280 may form the coupling portions 1020 that protrude corresponding to the plurality of recesses (e.g., the recesses 1010) in the positions corresponding to the plurality of recesses (e.g., the recesses 1010). As another example, when the plurality of protrusions are formed on the inner surface of the antenna (e.g., the second antenna A2), the protective cover 280 may form recessed coupling portions 1020 corresponding to the plurality of protrusions in the positions corresponding to the plurality of protrusions.

According to an embodiment, the plurality of recesses (e.g., the recesses 1010) and/or the plurality of protrusions of the antenna (e.g., the second antenna A2) may be formed adjacent to the segmenter (e.g., the third segmenter 3211 or the fourth segmenter 3212) having a non-conductive material. The plurality of recesses (e.g., the recess 1010) and/or the plurality of protrusions may be formed on the two opposite sides of each segmenter (e.g., the third segmenter 3211 or the fourth segmenter 3212) of the antenna (e.g., the second antenna A2) and be configured in an even number. In this case, the plurality of coupling portions 1020 of the protective cover 280 may also be configured in an even number.

According to an embodiment, the plurality of coupling portions 1020 of the protective cover 280 may be coupled to the plurality of recesses (e.g., the recesses 1020) and/or the plurality of protrusions of the antenna (e.g., the second antenna A2), fixing the conductive portion (e.g., the second conductive portion 321) adjacent to the segmenter (e.g., the third segmenter 3211 or the fourth segmenter 3212). Accordingly, the coupling portion 1020 of the protective cover 280 may prevent or reduce the conductive portion (e.g., the second conductive portion 321) adjacent to the segmenter (e.g., the third segmenter 3211 or the fourth segmenter 3212) from being spaced apart from the segmenter (e.g., the third segmenter 3211 or the fourth segmenter 3212) and parting away from the segmenter (e.g., direction ⑤) when external impact is applied to the first housing 210 (e.g., the cover housing 214). If the conductive portion (e.g., the second conductive portion 321) adjacent to the segmenter (e.g., the third segmenter 3211 or the fourth segmenter 3212) is parted, the communication performance of the electronic device 200 may be deteriorated. The coupling portion 1020 of the protective cover 280 may fix two opposite sides of the segmenter (e.g., the third segmenter 3211 or the fourth segmenter 3212), preventing or reducing deterioration of the communication performance due to external impact.

Figure 11A:
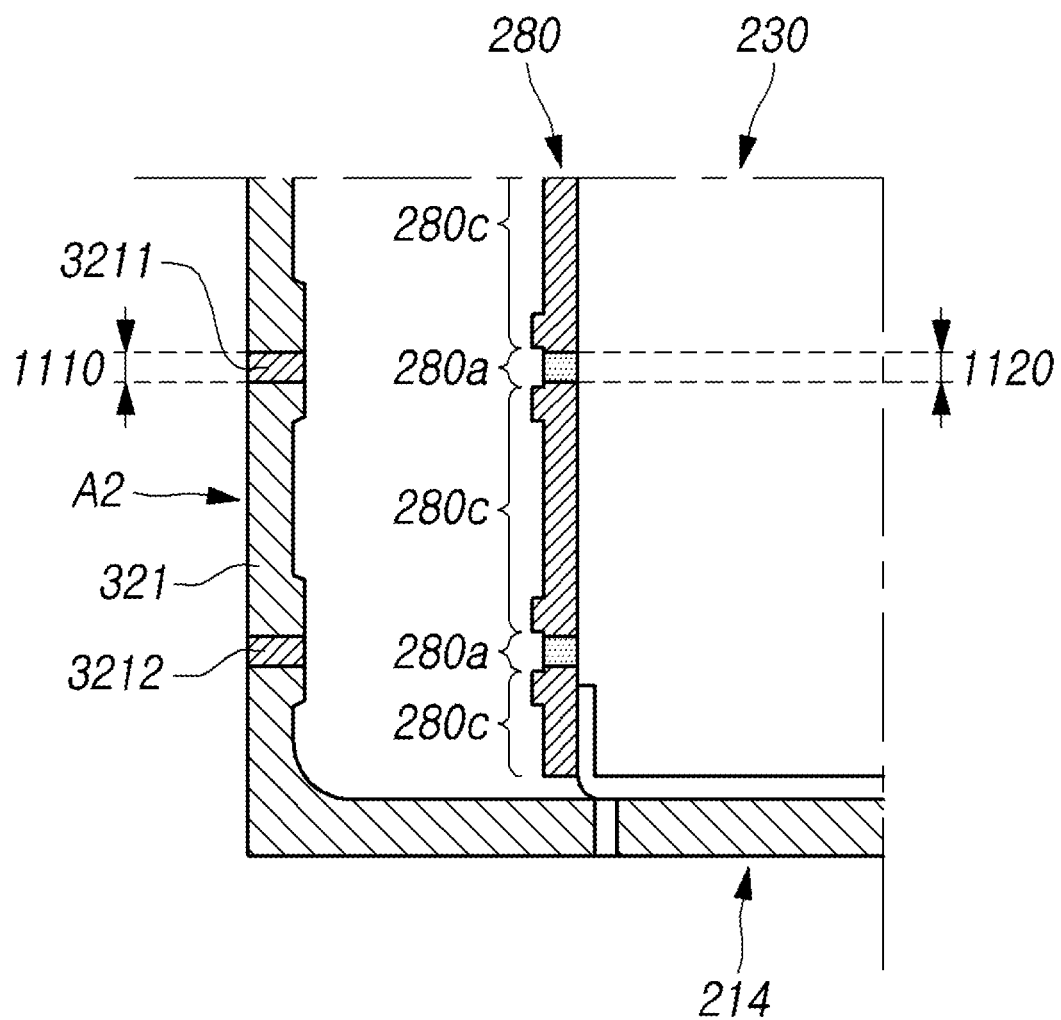
FIGS. 11A, 11B, and 11C are views illustrating a material of a portion of a protective cover corresponding to a segmenter according to various embodiments.
Figure 11B:
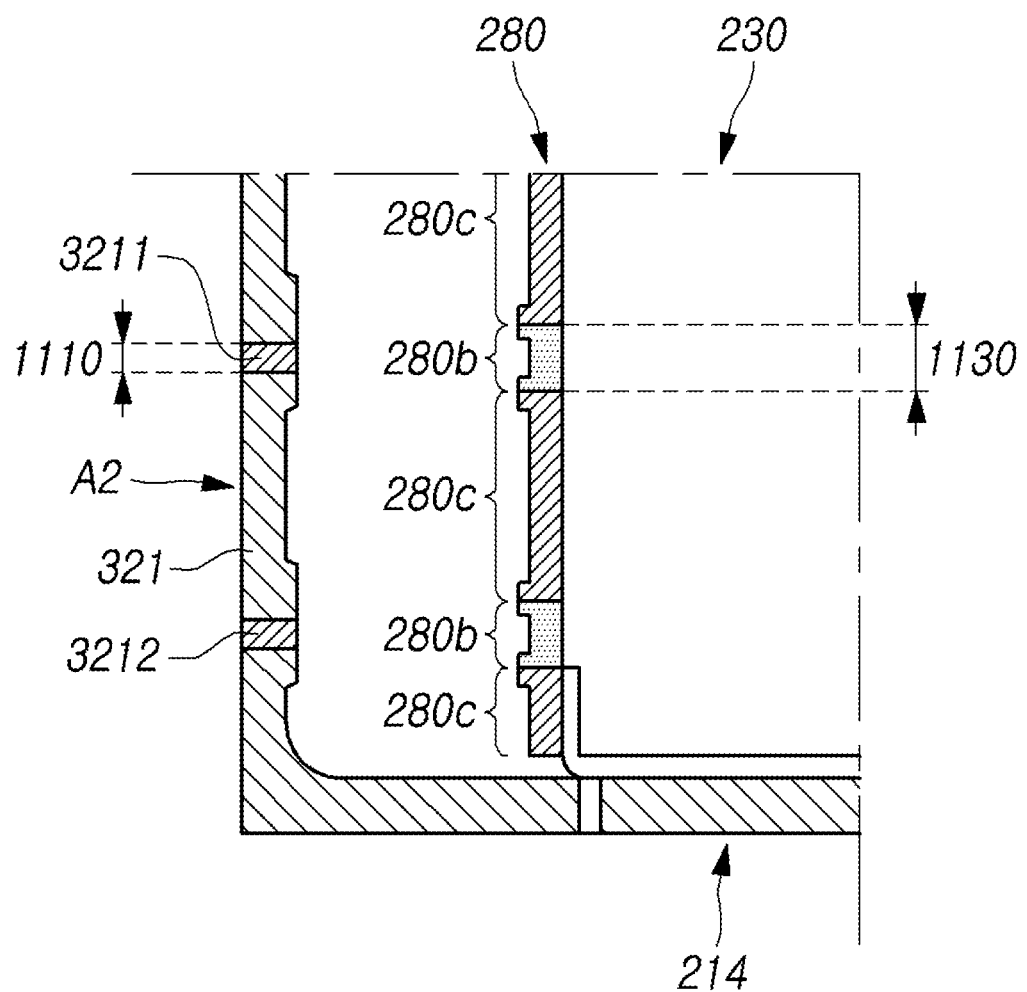
Figure 11C:
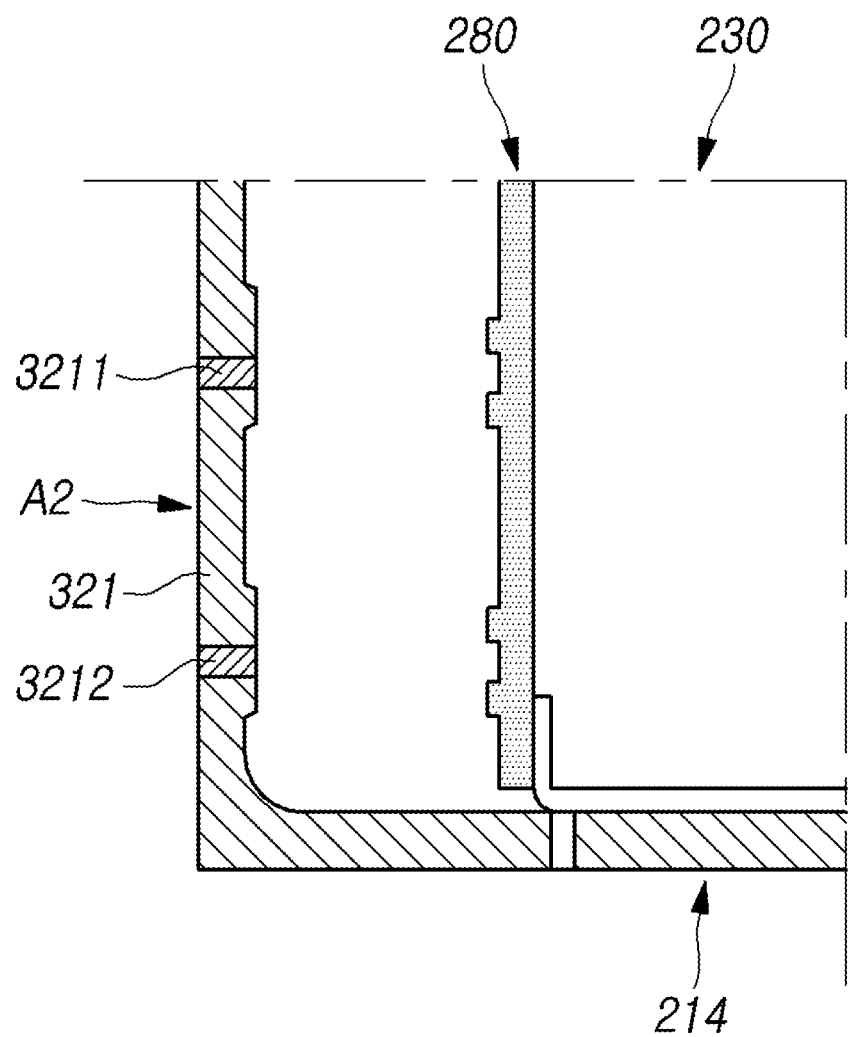

FIGS. 11A, 11B, and 11C are views illustrating a material of a portion of a protective cover corresponding to a segmenter according to various embodiments.

Referring to FIGS. 11A to 11C, an electronic device 200 may include a first housing 210, a second housing 220, a flexible display 230, and/or a protective cover 280. The illustrated configuration of the first housing 210, the second housing 220, the flexible display 230 and/or the protective cover 280 may be identical in whole or part to the configuration of the corresponding first housing 210, the second housing 220, the flexible display 230, and/or the protective cover 280 of FIGS. 2 to 4 and/or FIG. 7.

According to an embodiment, a portion of the protective cover 280 may be formed of a conductive material (e.g., metal), and the rest may be formed of a non-conductive material (e.g., injection-molded one). For example, in the protective cover 280, the conductive material (e.g., metal) and the non-conductive material (e.g., injection-molded one) may be integrally formed.

According to an embodiment, in the protective cover 280, the section (e.g., the first section 280a or second section 280b) corresponding to the segmenter (e.g., the third segmenter 3211 or the fourth segmenter 3212) of the antenna (e.g., the second antenna A2) provided on the side (e.g., the second side surface 2112) of the first housing 210 (e.g., the cover housing 214) may be formed of a non-conductive material (e.g., injection-molded one), and the rest (e.g., the third section 280c) may be formed of a conductive material (e.g., metal). The width (e.g., the first width 1120) of the portion (e.g., the first section 280a) formed of the non-conductive material (e.g., injection-molded one) in the protective cover 280 may be substantially equal to the width 1110 of, e.g., the segmenter (e.g., the third segmenter 3211 or the fourth segmenter 3212). The portion contacting the segmenter (e.g., the third segmenter 3211 or the fourth segmenter 3212) in the first section 280a or the second section 280b of the protective cover 280 may be formed of, e.g., a non-conductive material (e.g., injection-molded one), and the rest adjacent to the flexible display 230 side may be formed of, e.g., a conductive material (e.g., metal).

According to an embodiment, the segmenter (e.g., the third segmenter 3211 or the fourth segmenter 3212) is a component for electrically insulating the conductive portions disposed on the two opposite sides. To prevent or reduce the conductive portion spaced apart by the segmenter (e.g., the third segmenter 3211 or the fourth segmenter 3212) from being electrically connected through the protective cover 280 contacting the antenna (e.g., the second antenna A2), the section (e.g., the first section 280a or the second section 280b) corresponding to the segmenter (e.g., the third segmenter 3211 or the fourth segmenter 3212) in the protective cover 280 may be formed of a non-conductive material (e.g., injection-molded one).

According to an embodiment, the width (e.g., the second width 1130) of the section (e.g., the second section 280b) formed of the non-conductive material (e.g., injection-molded one) in the protective cover 280 may be larger than the width 1110 of the segmenter (e.g., the third segmenter 3211 or the fourth segmenter 3212). According to some embodiments, the protective cover 280 may be overall formed of a non-conductive material (e.g., injection-molded one) or a conductive material (e.g., metal).

Figure 12:
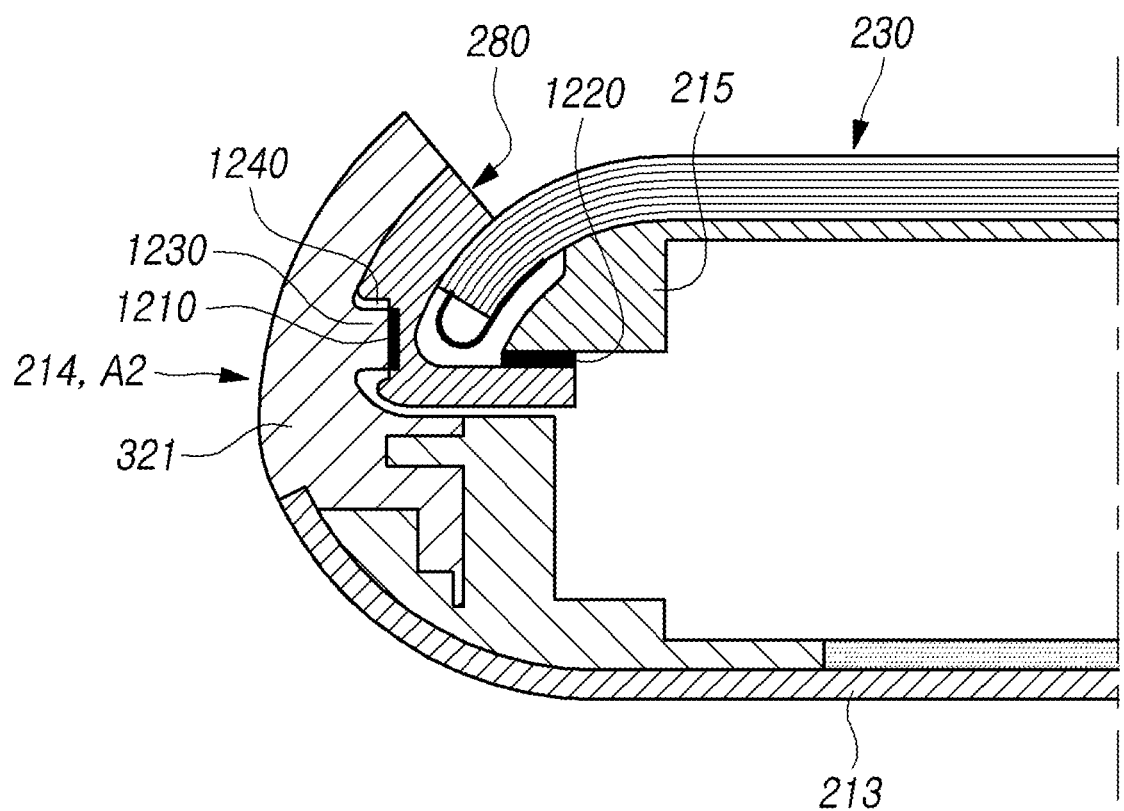
FIG. 12 is a cross-sectional view illustrating a ground structure of an antenna using a protective cover according to an example embodiment.

FIG. 12 is a cross-sectional view illustrating a ground structure of an antenna using a protective cover according to an embodiment.

Referring to FIG. 12, an electronic device 200 may include a first housing 210, a second housing 220, a flexible display 230, and/or a protective cover 280. The illustrated configuration of the first housing 210, second housing 220, flexible display 230, or protective cover 280 may be identical in whole or part to the configuration of the first housing 210, the second housing 220, the flexible display 230, the flexible display 230, or the protective cover 280 of FIG. 2 to 4, 7, or 10.

According to an embodiment, the electronic device 200 may further include a conductive gasket (e.g., the first conductive gasket 1210 and the second conductive gasket 1220) disposed on the protective cover 280. The first conductive gasket 1210 may be positioned at a portion in which the protective cover 280 contacts the antenna (e.g., the second antenna A2) provided on the side surface (e.g., the second side surface 2112) of the cover housing 214. Specifically, the first conductive gasket 1210 may be positioned between the protrusion 1230 of the second antenna A2 and the recess-shaped coupling portion 1240 of the protective cover 280. The second conductive gasket 1220 may be positioned at a portion where the protective cover 280 and the bracket housing 215 contact each other. The ground structure for allowing the current flowing through the antenna (e.g., the second antenna A2) to flow to the bracket housing 215 through the protective cover 280 may be configured by providing, e.g., the first conductive gasket 1210 and the second conductive gasket 1220. Accordingly, it is possible to omit a separate ground structure by replacing the ground structure for the antenna (e.g., the second antenna A2) with the protective cover 280.

Figure 13:
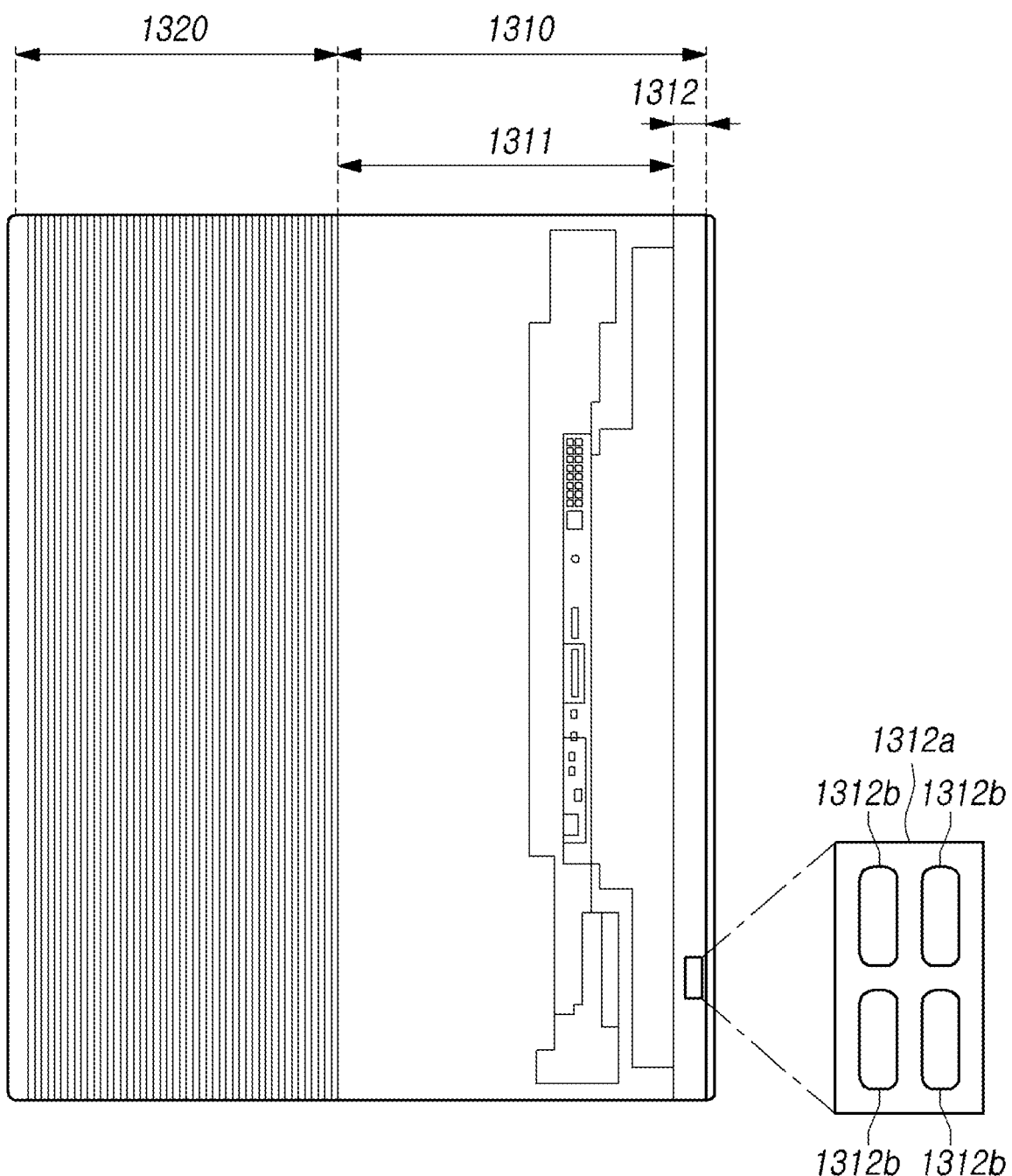
FIG. 13 is a plan view illustrating a support sheet according to an example embodiment.

FIG. 13 is a plan view illustrating a support sheet according to an embodiment.

The support sheet 270 of FIG. 13 may be the same as or similar to the support sheet 270 illustrated in FIG. 4.

Referring to FIG. 13, the support sheet 270 may include a fixed portion (e.g., the fixed area 1310 corresponding to the first width W1 of FIG. 3A) of the flexible display 230 and a bending area 1320 corresponding to the rolling or bending portion (e.g., the second width W2 of FIG. 3A) of the flexible display 230. The fixed area 1310 may be divided into a flat area 1311 corresponding to the flat portion of the flexible display 230 and an edge area 1312 corresponding to the fixed portion (e.g., the edge portion 231 of FIG. 4).

According to an embodiment, the support sheet 270 may form a lattice structure 1312*a* in at least a portion of the bending area 1320 and the edge area 1312, which are bends of the flexible display 230. The lattice structure 1312*a* may include a plurality of openings 1312*b* and may contribute to the bendability of the flexible display 230. The lattice structure 1312*a* may be referred to as an 'opening pattern'. The plurality of openings 1312*b* may be formed, e.g., periodically and be arranged repeatedly with a predetermined interval in the same shape. In the support sheet 270, the bending area 1320 and the edge area 1312 may have bendability by having the lattice structure 1312*a*.

According to an embodiment, to implement an edge shape in the fixed portion (e.g., the edge portion 231), the degree of bending of the fixed portion (e.g., the edge portion 231) may be increased. In this case, the repulsive force of the fixed portion (e.g., the edge portion 231) is increased. According to an embodiment, the repulsive force of the fixed portion (e.g., the edge portion 231) may be reduced by increasing the width of the edge area 1312 of the support sheet 270 to broaden the area contributing to the bendability of the fixed portion (e.g., edge portion 231). For example, if the width of the edge area 1312 of the support sheet 270 is increased, the area of the lattice structure 1312*a* increases, thereby securing bendability of the fixed portion (e.g., the edge portion 231). If the bendability of the fixed portion (e.g., the edge portion 231) is secured, the support sheet 270 may be easily attached to the fixed portion (e.g., the edge portion 231).

According to an embodiment, the support sheet 270 may include a recess pattern (not shown) including a plurality of recesses, replacing the lattice structure 1312*a*. The recess pattern may contribute to bendability of the flexible display 230. The support sheet 270 including a lattice structure and/or a recess pattern, and/or a conductive member corresponding thereto, may be formed of, e.g., a plurality of layers.

Figure 14:
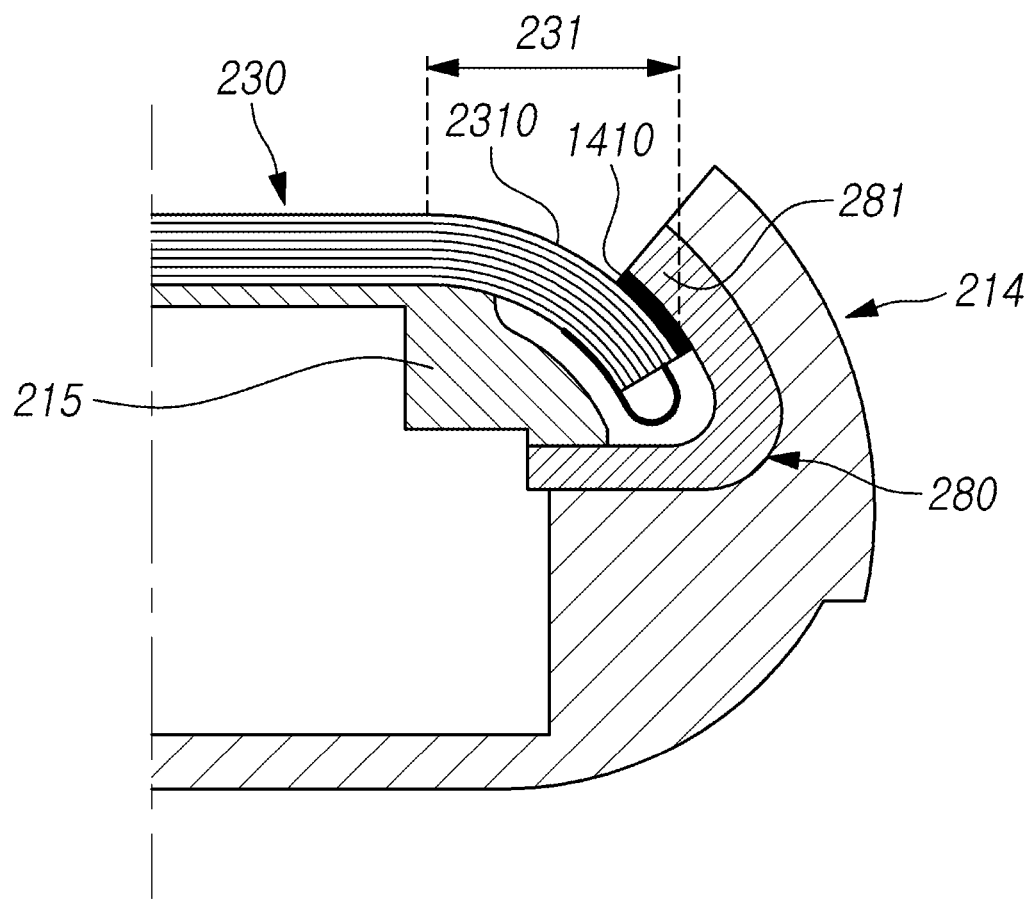
FIG. 14 is a cross-sectional view illustrating an electronic device including an anti-foreign body portion according to an example embodiment.

FIG. 14 is a cross-sectional view illustrating an electronic device including an anti-foreign body portion according to an embodiment.

Referring to FIG. 14, an electronic device 200 may include a first housing 210, a second housing 220, a flexible display 230, and/or a protective cover 280. The illustrated configuration of the first housing 210, the second housing 220, the flexible display 230 or the protective cover 280 may be identical in whole or part to the configuration of the first housing 210, the second housing 220, the flexible display 230, or the protective cover 280 of FIGS. 2 to 4 or FIG. 7.

According to an embodiment, the electronic device 200 may further include anti-foreign body portion 1410 between the fixed portion (e.g., the edge portion 231) of the flexible display 230 and the protective cover 280. The anti-foreign body portion 1410 may be positioned to contact an edge inner surface of the first portion 281 of the protective cover 280 and at least a portion of the fixed portion (e.g., the edge portion 231). In this case, the anti-foreign body portion 1410 may block the entrance of an external foreign body by sealing the gap between the protective cover 280 and the fixed portion (e.g., the edge portion 231). The anti-foreign body portion 1410 may be attached to, e.g., the protective cover 280 and/or the fixed portion (e.g., an edge portion 231). The anti-foreign body portion/material 1410 may be formed of a low-density elastic material, such as a sponge.

Figure 15:
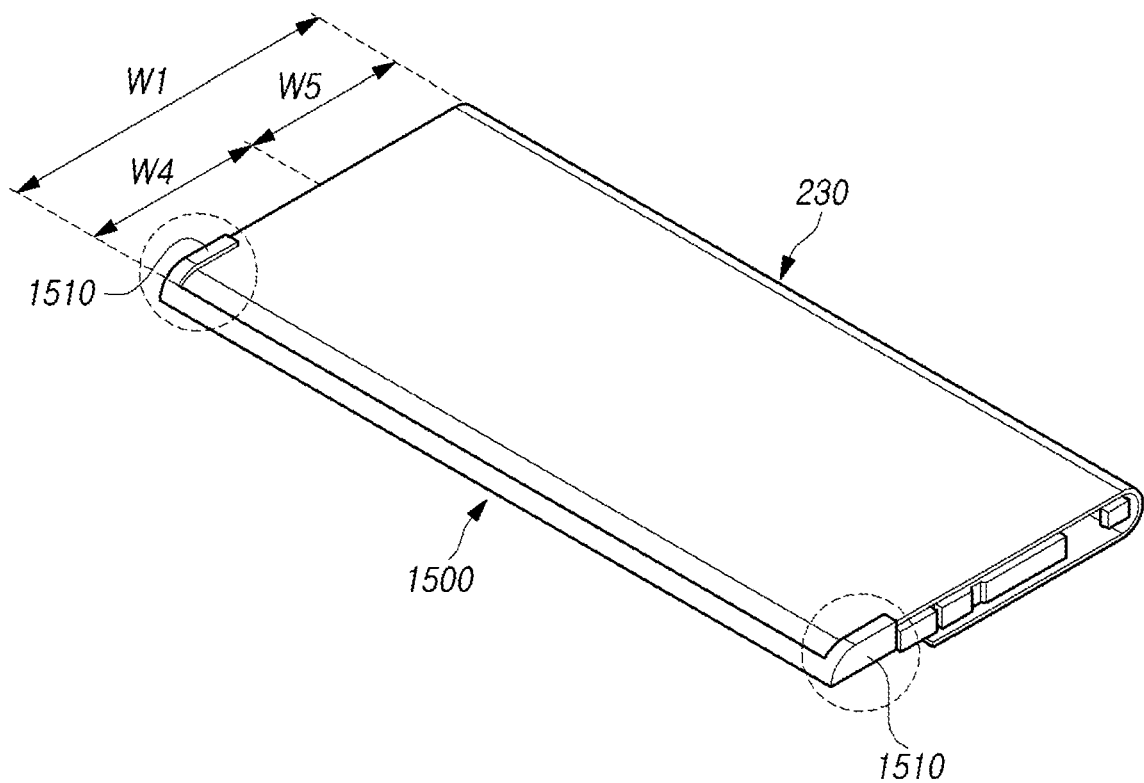
FIG. 15 is a view illustrating a protective cover and its surrounding configuration in an electronic device according to another example embodiment.

FIG. 15 is a view illustrating a protective cover and its surrounding configuration in an electronic device according to another embodiment.

Referring to FIG. 15, an electronic device 200 may include a first housing 210, a second housing 220, a flexible display 230, and/or a protective cover 1500. The illustrated configuration of the first housing 210, the second housing 220, the flexible display 230 or the protective cover 280 may be identical in whole or part to the configuration of the first housing 210, the second housing 220, the flexible display 230, or the protective cover 280 of FIGS. 2 to 4 or FIG. 7. The electronic device 200 may have a display area of the first width W1 in the closed state.

According to an embodiment, at least a portion of the area corresponding to the first width W1 of the flexible display 230 (hereinafter, referred to as a "first width W1 of the flexible display 230") may be attached to the upper portion of the first housing 210 (e.g., the bracket housing 215 of FIG. 4). The flexible printed circuit board (FPCB) may be provided to be electrically connected to an extension (e.g., the extension 232 of FIG. 5A) of the rear surface of the first width W1 of the flexible display 230. Accordingly, when the first width W1 of the flexible display 230 is attached to the first housing 210 (e.g., the bracket housing 215 of FIG. 4), the fourth width W4 which is the area provided with the flexible printed circuit board is not attached to the upper portion of the first housing 210 (e.g., the bracket housing 215 of FIG. 4), but only the fifth width W5, which is the remaining area, may be attached to the upper portion of the first housing 210 (e.g., the bracket housing 215 of FIG. 4) by an adhesive member, such as an adhesive tape.

According to an embodiment, the protective cover 280 may further include a fixing portion 1510 formed to extend in the direction parallel to the direction of the first width W1 from two opposite ends in the length direction to press a portion of the flexible display 230. Here, the length direction may be a direction substantially perpendicular to the direction of the first width W1. The fixing portion 1510 may be smaller than the length of the fourth width W4. The fixing portion 1510 may prevent or reduce a peel-off of the area corresponding to the fourth width W4 of the flexible display 230, preventing or reducing deterioration of the communication performance of the antennas (e.g., the first antenna A1, the second antenna A2, and the third antenna A3 of FIG. 2A) due to a movement of the flexible display 230.

Figure 16:
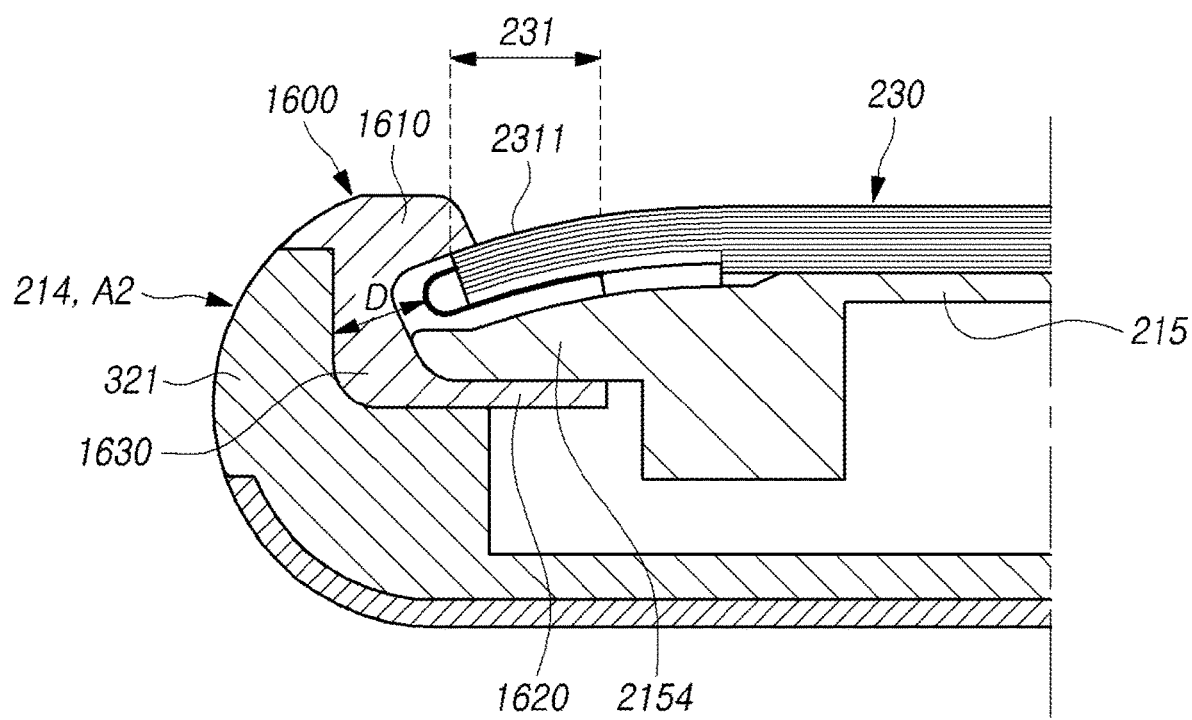
FIG. 16 is a cross-sectional view illustrating a protective cover for enhancing antenna communication performance according to another example embodiment.

FIG. 16 is a cross-sectional view illustrating a protective cover for enhancing antenna communication performance according to another embodiment.

Referring to FIG. 16, an electronic device 200 may include a first housing 210, a second housing 220, a flexible display 230, and/or a protective cover 1600. The illustrated configuration of the first housing 210, the second housing 220, the flexible display 230 or the protective cover 280 may be identical in whole or part to the configuration of the first housing 210, the second housing 220, the flexible display 230, or the protective cover 280 of FIGS. 2 to 4 or FIG. 7. The portion of the protective cover 280, overlapping the protective cover 280 of FIG. 7, is not further described.

According to an embodiment, the electronic device 200 further may include a protective cover 1600 disposed between at least the first housing 210 (e.g., the cover housing 214) and the flexible display 230 to protect the flexible display 230. The protective cover 1600 may be disposed, e.g., between the second side surface (e.g., the second side surface 2112) of the cover housing 214 and the side surface (e.g., the side surface 2153 of FIG. 4) of the bracket housing 215.

According to an embodiment, the protective cover 1600 may include a third portion 1610, a fourth portion 1620, and/or a curved portion 1630. A portion of the third portion 1610 of the protective cover 1600 may contact the flexible display 230. A portion of the fourth portion 1620 of the protective cover 1600 may contact the first housing 210 (e.g., the bracket housing 215). A portion of the third portion 1610 and the outer surface of the curved portion 1630 of the protective cover 1600 may contact a side surface (e.g., the second side surface 2112) of the first housing 210 (e.g., the cover housing 214).

According to an embodiment, the third portion 1610 of the protective cover 1600 may protrude so that a portion thereof is visible from the outside. One side of the portion protruding from the third portion 1610 of the protective cover 1600 may be formed to cover the upper end of the side surface (e.g., the second side surface 2112) of the first housing 210 (e.g., the cover housing 214), and the other side may be formed to cover a portion of the fixed portion (e.g., the edge portion 231). The third portion 1610 of the protective cover 1600 may have a shape of approximately T-shaped.

The protective cover 280 may be formed so that the third portion 1610 protrudes upward, thus further increasing the distance D between the flexible display 230 and the antenna (e.g., the second antenna A2). The protective cover 1600 may increase the distance between the flexible display 230 and the antenna (e.g., the second antenna A2) as compared to the protective cover 280 of FIG. 7, enhancing the communication performance of the antenna (e.g., the second antenna A2).

Figure 17A:
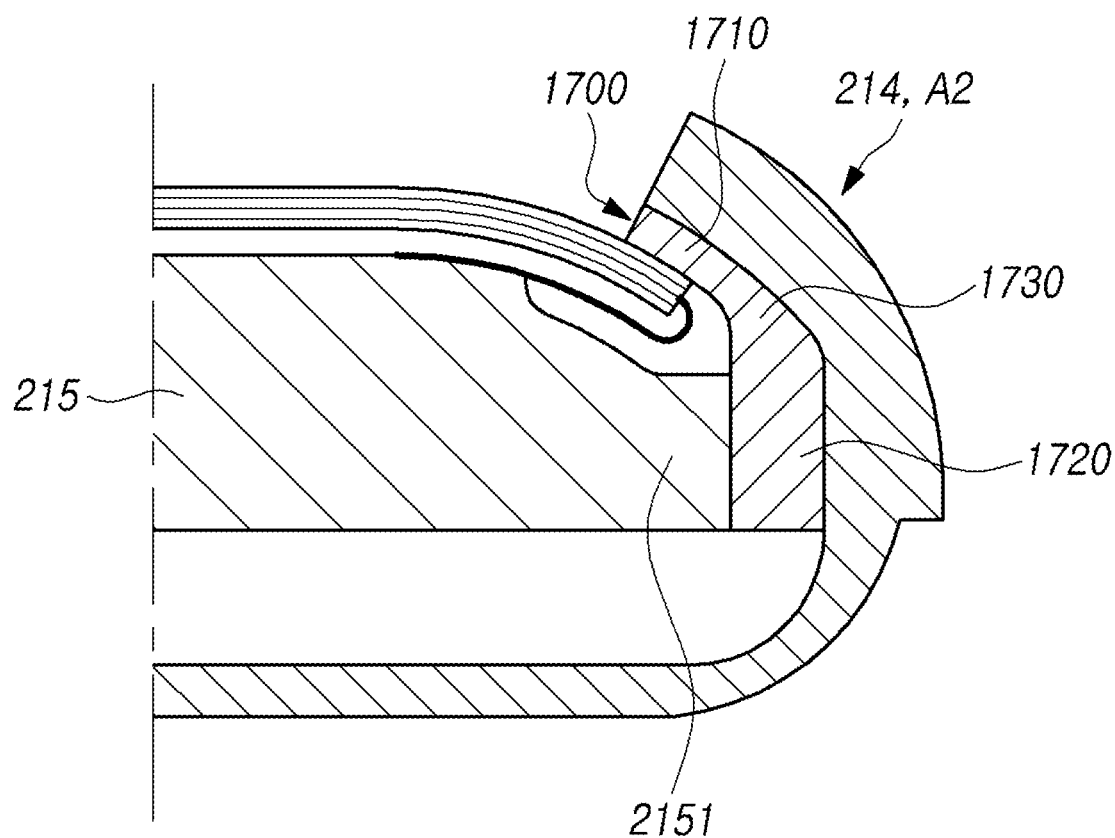
FIGS. 17A and 17B are cross-sectional views illustrating a protective cover for reinforcing the performance of protecting an extension from external impact according to another example embodiment.
Figure 17B:
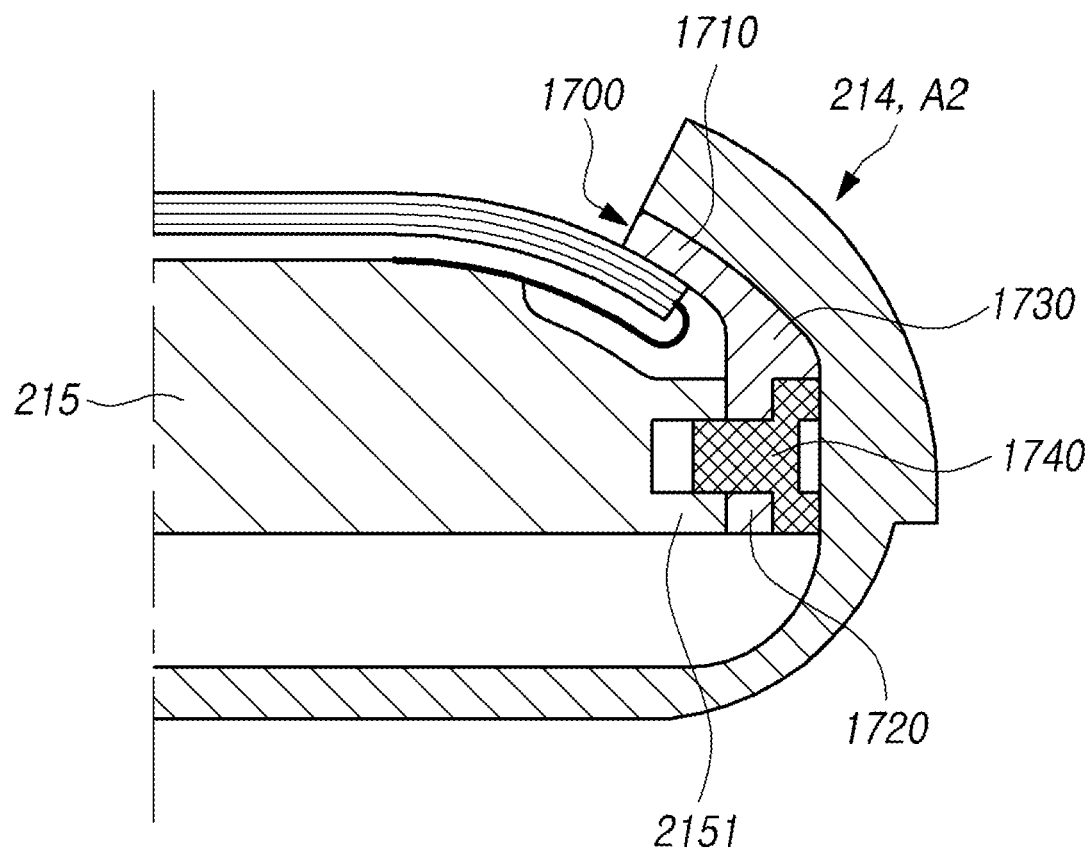

FIGS. 17A and 17B are cross-sectional views illustrating a protective cover for reinforcing the performance of protecting an extension from external impact according to another embodiment.

Referring to FIGS. 17A and 17B, an electronic device 200 may include a first housing 210, a second housing 220, a flexible display 230, and/or a protective cover 1700. The illustrated configuration of the first housing 210, the second housing 220, the flexible display 230 or the protective cover 280 may be identical in whole or part to the configuration of the first housing 210, the second housing 220, the flexible display 230, or the protective cover 280 of FIGS. 2 to 4 or FIG. 7. The portion of the protective cover 280, overlapping the protective cover 1700 of FIG. 7, is not further described.

According to an embodiment, the electronic device 200 further may include a protective cover 1700 disposed between at least the first housing 210 (e.g., the cover housing 214) and the flexible display 230 to protect the flexible display 230. The protective cover 1600 may be disposed, e.g., between the second side surface (e.g., the second side surface 2112) of the cover housing 214 and the side surface (e.g., the side surface 2153 of FIG. 4) of the bracket housing 215.

According to an embodiment, the protective cover 1700 may include a fifth portion 1710, a sixth portion 1720, and/or a curved portion 1730. A portion of the fifth portion 1710 of the protective cover 1700 may contact the flexible display 230. A portion of the sixth portion 1720 of the protective cover 1700 may contact the first housing 210 (e.g., the bracket housing 215). A portion of the fifth portion 1710 and the outer surface of the curved portion 1730 of the protective cover 1700 may contact a side surface (e.g., the second side surface 2112) of the first housing 210 (e.g., the cover housing 214).

According to an embodiment, the sixth portion 1720 of the protective cover 1700 may be disposed to extend in a substantially vertical direction. The vertical direction means a direction substantially perpendicular (e.g., perpendicular plus/minus 10 degrees or less) to the plane of the first area (e.g., the first area 230a of FIG. 3A) of the flexible display 230. Accordingly, the angle between the fifth portion 1710 and the sixth portion 1720 may be an obtuse angle. One surface of the sixth portion 1720 may face and contact the first housing 210 (e.g., the bracket housing 215). According to an embodiment, the protective cover 1700 may increase the area in contact with the first housing 210 (e.g., the bracket housing 215), more efficiently transferring external impact to the first housing 210 (e.g., the bracket housing 215). Accordingly, it is possible to more effectively protect the fixed portion (e.g., the edge portion 231) and/or the extension 232 from external impact. The sixth portion 1720 of the protective cover 1700 and the first housing 210 (e.g., the bracket housing 215) may be fastened to each other by, e.g., screwing.

According to an embodiment, the protective cover 1700 and the first housing 210 (e.g., the bracket housing 215) may be coupled by a connection member 1740. When an impact is applied to the electronic device 200, the impact applied to the first housing 210 (e.g., the cover housing 214) is transferred to the protective cover 1700. The impact transferred to the protective cover 1700 is transferred to the inner first housing 210 (e.g., the bracket housing 215) through the connection member 1740, so that the impact applied to the fixed portion (e.g., the edge portion 231) may be alleviated.

According to an embodiment, an electronic device (e.g., the electronic device 200 of FIG. 2A) may comprise a first housing (e.g., the first housing 210 of FIG. 4) including an antenna (e.g., the second antenna A2 of FIG. 2A) provided on a side surface thereof, a second housing (e.g., the second housing 220 of FIG. 4) provided to slide in a first direction (e.g., direction ① of FIG. 3A) to be at least partially drawn out of the first housing and to slide in a direction (e.g., direction ② of FIG. 2A) opposite to the first direction to be drawn into the first housing, a flexible display (e.g., the flexible display 230 of FIG. 4) including a first side having a fixed portion (e.g., the edge portion 231 of FIG. 4) and a second side provided to be drawn out of an inside of the first housing and/or drawn into the inside of the first housing according to an operation of the second housing, and a protective cover (e.g., the protective cover 280 of FIG. 4) provided between at least the fixed portion and the first housing to contact at least a portion of an upper portion (e.g., the upper portion 2311 of the edge portion of FIG. 7) of the fixed portion. A first space (e.g., the first space 710 of FIG. 7) may be provided between (directly or indirectly) the protective cover and a side portion (e.g., the side portion 2312 of FIG. 7) of the fixed portion.

According to an embodiment, the first housing may include a supporting member (e.g., the supporting member 2154 of FIG. 5A) fixing the protective cover.

According to an embodiment, an outer surface of the protective cover may be disposed to contact an inner surface of the antenna.

According to an embodiment, the antenna may include at least one segmenter (e.g., the third segmenter 3211 of FIG. 2A or the fourth segmenter 3212 of FIG. 2A) formed of a non-conductive material. A portion (e.g., the first section 280*a* of the protective cover 280 of FIG. 11A) of the protective cover, corresponding to the at least one segmenter, may be formed of a non-conductive material.

According to an embodiment, a width (e.g., the second width 1130 of FIG. 11B) of the portion (e.g., the second section 280*b* of the protective cover 280 of FIG. 11B), formed of the non-conductive material, of the protective cover is larger than a width (e.g., the width 1110 of the segmenter of FIG. 11B) of the segmenter.

According to an embodiment, the antenna may include at least one segmenter formed of a non-conductive material. A plurality of recesses or a plurality of protrusions (e.g., the recess 1010 of FIG. 10 may be provided in an inner surface of the antenna. The protective cover may include coupling portions (e.g., the coupling portion 1020 of FIG. 10) in positions corresponding to the plurality of recesses or the plurality of protrusions. The coupling portions may correspond in shape to the plurality of recesses or the plurality of protrusions.

According to an embodiment, the plurality of recesses or the plurality of protrusions may be formed adjacent to the at least one segmenter.

According to an embodiment, the protective cover may have a ground structure to protect an internal circuit of the electronic device from a current flowing through the antenna.

According to an embodiment, a portion of the protective cover (e.g., the protective cover 1600 of FIG. 16) may be provided to protrude between (directly or indirectly) a side surface of the first housing and the flexible display.

According to an embodiment, the electronic device may further include an anti-foreign body portion (e.g., the anti-foreign body portion 1410 of FIG. 14) provided at a portion where the protective cover contacts the fixed portion.

According to an embodiment, the protective cover may be formed of a conductive material, a non-conductive material, or a combination of the conductive material and the non-conductive material.

According to an embodiment, a second space (e.g., the second space 720 of FIG. 7) may be provided under the fixed portion (e.g., the lower portion 2313 of the edge portion of FIG. 7).

According to an embodiment, the protective cover (e.g., the protective cover 1500 of FIG. 15) may include a fixed portion (e.g., the fixed portion 1510 of FIG. 15) extending from an end, in a length direction, of the protective cover in a direction perpendicular to the length direction to press at least a portion of a flat portion of the flexible display.

According to an embodiment, the protective cover and the first housing may be fastened by screwing.

According to an embodiment, the protective cover may include a first portion (e.g., the first portion 281 of FIG. 7) contacting an upper portion of the fixed portion, a second portion (e.g., the second portion 282 of FIG. 7) contacting a portion of the first housing, and a curved portion (e.g., the curved portion 283 of FIG. 7) connecting the first portion and the second portion.

According to an embodiment, the second portion of the protective cover may extend in a lower direction perpendicular to a flat portion of the flexible display and face and contact a supporting member formed to contact the protective cover in the first housing.

According to an embodiment, the second portion of the protective cover may extend in a lower direction perpendicular to a flat portion of the flexible display. The electronic device may further comprise a connecting member connecting the second portion and a supporting member formed to be connected with the protective cover in the first housing.

According to an embodiment, as a radius of curvature of the fixed portion decreases, an area where the fixed portion overlaps the protective cover may increase.

According to an embodiment, the protective cover may have a thickness ranging from 0.4 T to 0.8 T.

According to an embodiment, the electronic device may further comprise an extension (e.g., the extension 232 of FIG. 5A) extending from a side portion of the fixed portion to be electrically connected with a flexible printed circuit board positioned on a rear surface of the flexible display.

According to an embodiment, the fixed portion may be formed to be bent toward a side surface of the first housing, and at least a portion of the fixed portion may form at least a portion of the side surface of the first housing.

According to an embodiment, the flexible display may include a plurality of stacked layers. The protective cover may prevent or reduce the likelihood of a peel-off of the fixed portion due to a slip between the plurality of layers when the flexible display is drawn out of the inside of the first housing or drawn into the inside of the first housing.

According to an embodiment, the protective cover may be provided to maintain a spacing between the antenna and the fixed portion regardless of whether the flexible display is drawn in or out.

According to an embodiment, the protective cover may include a conductive portion at least partially formed of a conductive material and a non-conductive portion at least partially formed of a non-conductive material. The antenna may include at least one segmenter formed of a non-conductive material. The protective cover may be disposed so that the conductive portion does not contact the segmenter.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", or "connected to" another element (e.g., a second element), it means that the element may be coupled with the other element directly (e.g., wiredly), wirelessly, or via at least a third element.

As used in connection with various embodiments, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device, comprising:
   a first housing including a bracket housing and a cover housing;
   a second housing configured to slide to be at least partially drawn into and out of the first housing;
   a flexible display configured to be drawn out of an inside of the second housing based on sliding-out movement of the second housing and/or drawn into the inside of the second housing based on sliding-in movement of the second housing, an edge area of the flexible display comprising a fixed portion fixed to the bracket housing of the first housing and a first curved portion including a curved surface; and
   a protective cover provided between at least a portion of the edge area of the flexible display and the cover housing of the first housing, and configured to press the at least portion of the edge area of the flexible display towards the bracket housing of the first housing to protect the at least portion of the edge area of the flexible display.

2. The electronic device of claim 1, wherein the first housing supports the flexible display, and includes a supporting member fixing the protective cover.

3. The electronic device of claim 1, further comprising an antenna disposed to contact an outer surface of the protective cover.

4. The electronic device of claim 3, wherein the antenna includes at least one segmenter formed of a non-conductive material, and
   wherein a portion of the protective cover, corresponding to the at least one segmenter, is formed of a non-conductive material.

5. The electronic device of claim 4, wherein a width of the portion, formed of the non-conductive material, of the protective cover, is larger than a width of the segmenter.

6. The electronic device of claim 3, wherein the antenna includes at least one segmenter formed of a non-conductive material,
   wherein a plurality of recesses and/or a plurality of protrusions are provided in an inner surface of the antenna, and
   wherein the protective cover includes coupling portions in positions corresponding to the plurality of recesses and/or the plurality of protrusions, the coupling portions corresponding in shape to the plurality of recesses and/or the plurality of protrusions, and wherein the plurality of recesses and/or the plurality of protrusions are formed adjacent to the at least one segmenter.

7. The electronic device of claim 1, wherein the protective cover comprises a ground structure configured to protect an internal circuit of the electronic device from a current flowing through the antenna.

8. The electronic device of claim 1, wherein a portion of the protective cover is provided to protrude between a side surface of the first housing and the flexible display.

9. The electronic device of claim 1, further comprising an anti-foreign body material provided at a portion where the protective cover contacts the edge area of the flexible display.

10. The electronic device of claim 1, wherein the protective cover is formed of a conductive material, a non-conductive material, or a combination of the conductive material and the non-conductive material.

11. The electronic device of claim 1,
wherein a first space is provided between at least the protective cover and a side portion of the edge area, and
wherein a second space is provided under the edge area of the flexible display.

12. The electronic device of claim 1, wherein the protective cover includes a fixed portion extending from an end, in a length direction, of the protective cover in a direction perpendicular to the length direction to press at least a portion of a flat portion of the flexible display.

13. The electronic device of claim 1, wherein the protective cover and the bracket housing are fastened to each other at least by screwing.

14. The electronic device of claim 1, wherein the protective cover includes a first portion contacting an upper portion of the edge area of the flexible display, a second portion contacting a portion of the first housing, and a second curved portion connecting the first portion and the second portion, and
wherein the second portion of the protective cover extends in a lower direction perpendicular to a flat portion of the flexible display and faces and contacts a supporting member formed to contact the protective cover in the first housing.

15. The electronic device of claim 1, wherein the protective cover includes a first portion contacting an upper portion of the edge area of the flexible display, a second portion contacting a portion of the bracket housing, and a second curved portion connecting the first portion and the second portion,
wherein the second portion of the protective cover extends in a lower direction perpendicular to a flat portion of the flexible display, and
wherein the electronic device further comprises a connecting member connecting the second portion and a supporting member formed to be connected with the protective cover in the first housing.

16. The electronic device of claim 1, wherein as a radius of curvature of the edge area of the flexible display decreases, an area where the edge area of the flexible display overlaps the protective cover increases.

17. The electronic device of claim 1, wherein the protective cover has a thickness ranging from 0.4 T to 0.8 T.

18. The electronic device of claim 1, further comprising an extension extending from a side of the edge area of the flexible display and configured to be electrically connected with a flexible printed circuit board positioned on a rear surface of the flexible display.

19. The electronic device of claim 1, wherein the flexible display includes a plurality of stacked layers, and
wherein the protective cover is configured to reduce likelihood of a peel-off of the edge area of the flexible display due to a slip between the plurality of layers when the flexible display is drawn out of the inside of the first housing and/or drawn into the inside of the first housing.

20. The electronic device of claim 1, wherein the protective cover includes a conductive portion at least partially formed of a conductive material and a non-conductive portion at least partially formed of a non-conductive material,
wherein the antenna includes at least one segmenter formed of a non-conductive material, and
wherein the protective cover is disposed so that the conductive portion does not contact the segmenter.

* * * * *